(12) United States Patent
Huo et al.

(10) Patent No.: US 11,183,512 B2
(45) Date of Patent: Nov. 23, 2021

(54) METHODS FOR FORMING THREE-DIMENSIONAL MEMORY DEVICE WITH SUPPORT STRUCTURE AND RESULTING THREE-DIMENSIONAL MEMORY DEVICE

(71) Applicant: YANGTZE MEMORY TECHNOLOGIES CO., LTD., Wuhan (CN)

(72) Inventors: Zongliang Huo, Wuhan (CN); Haohao Yang, Wuhan (CN); Wei Xu, Wuhan (CN); Ping Yan, Wuhan (CN); Pan Huang, Wuhan (CN); Wenbin Zhou, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 79 days.

(21) Appl. No.: 16/670,571

(22) Filed: Oct. 31, 2019

(65) Prior Publication Data

US 2020/0395373 A1 Dec. 17, 2020

Related U.S. Application Data

(63) Continuation of application No. PCT/CN2019/102113, filed on Aug. 23, 2019.

(30) Foreign Application Priority Data

Jun. 17, 2019 (CN) .......................... 201910522873.1

(51) Int. Cl.
*H01L 27/11582* (2017.01)
*H01L 21/311* (2006.01)
*H01L 27/11556* (2017.01)

(52) U.S. Cl.
CPC ... *H01L 27/11582* (2013.01); *H01L 21/31111* (2013.01); *H01L 21/31144* (2013.01); *H01L 27/11556* (2013.01)

(58) Field of Classification Search
CPC ......... H01L 27/11582; H01L 27/11556; H01L 21/31144; H01L 21/31111; H01L 27/11568; H01L 27/11578
See application file for complete search history.

(56) References Cited

U.S. PATENT DOCUMENTS 9,754,963 B1 9/2017 Kawamura et al.
10,050,054 B2 8/2018 Zhang et al.
(Continued)

FOREIGN PATENT DOCUMENTS

CN 104659033 A 5/2015
CN 105097822 A 11/2015
(Continued)

OTHER PUBLICATIONS

International Search Report issued in corresponding International Application No. PCT/CN2019/102133, dated Mar. 20, 2020, 5 page.
(Continued)

*Primary Examiner* — Thanh Y. Tran
(74) *Attorney, Agent, or Firm* — Bayes PLLC

(57) ABSTRACT

Embodiments of structure and methods for forming a three-dimensional (3D) memory device are provided. In an example, a 3D memory device includes a memory stack, a plurality of channel structures, a slit structure, and a source structure. The memory stack may be over a substrate and may include interleaved a plurality of conductor layers and a plurality of insulating layers extending laterally in the memory stack. The plurality of channel structures may extend vertically through the memory stack into the substrate. The slit structure may extend vertically and laterally (Continued)

in the memory stack and divide the plurality of memory cells into at least one memory block. The slit structure may include a plurality of protruding portions and a plurality of recessed portions arranged vertically along a sidewall of the slit structure.

19 Claims, 18 Drawing Sheets

(56) References Cited

U.S. PATENT DOCUMENTS

| | | | |
|---|---|---|---|
| 10,269,820 | B1 | 4/2019 | Kaminaga |
| 2008/0164491 | A1 | 7/2008 | Liu et al. |
| 2012/0094453 | A1 | 4/2012 | Han et al. |
| 2012/0098049 | A1 | 4/2012 | Moon et al. |
| 2013/0168800 | A1 | 7/2013 | Shim et al. |
| 2014/0217488 | A1 | 8/2014 | Thimmegowda et al. |
| 2014/0284697 | A1 | 9/2014 | Wang et al. |
| 2015/0318301 | A1* | 11/2015 | Lee .................. H01L 27/11582 257/324 |
| 2015/0357341 | A1 | 12/2015 | Yeh et al. |
| 2016/0126252 | A1 | 5/2016 | Tsuda et al. |
| 2016/0336338 | A1 | 11/2016 | Song et al. |
| 2016/0358933 | A1 | 12/2016 | Rabkin et al. |
| 2017/0047334 | A1 | 2/2017 | Lu et al. |
| 2017/0117289 | A1 | 4/2017 | Liu et al. |
| 2017/0309339 | A1 | 10/2017 | Hsiung et al. |
| 2018/0097009 | A1 | 4/2018 | Zhang et al. |
| 2018/0233513 | A1 | 8/2018 | Zhang et al. |
| 2018/0366483 | A1* | 12/2018 | Choi ................ H01L 27/11582 |
| 2019/0067314 | A1 | 2/2019 | Lu et al. |
| 2019/0096899 | A1 | 3/2019 | Tagami et al. |
| 2020/0185408 | A1 | 6/2020 | Song et al. |

FOREIGN PATENT DOCUMENTS

| | | |
|---|---|---|
| CN | 107810554 A | 3/2018 |
| CN | 108511454 A | 9/2018 |
| CN | 108538841 A | 9/2018 |
| CN | 108831887 A | 11/2018 |
| CN | 108987405 A | 12/2018 |
| CN | 109314118 A | 2/2019 |
| CN | 109346477 A | 2/2019 |
| CN | 109690776 A | 4/2019 |
| CN | 109698201 A | 4/2019 |
| CN | 109727995 A | 5/2019 |
| CN | 109786382 A | 5/2019 |
| CN | 110112134 A | 8/2019 |
| WO | 2019022814 A1 | 1/2019 |

OTHER PUBLICATIONS

Written Opinion of the International Searching Authority issued in corresponding International Application No. PCT/CN2019/102133, dated Mar. 20, 2020, 5 page.

International Search Report issued in corresponding International Application No. PCT/CN2019/102116, dated Mar. 18, 2020, 4 page.

Written Opinion of the International Searching Authority issued in corresponding International Application No. PCT/CN2019/102116, dated Mar. 18, 2020, 5 page.

Machine-generated English translation of CN108538841, total p. 12 (Year: 2018).

International Search Report issued in corresponding International Application No. PCT/CN2019/102121, dated Mar. 18, 2020, 5 page.

Written Opinion of the International Searching Authority issued in corresponding International Application No. PCT/CN2019/102121, dated Mar. 18, 2020, 5 page.

International Search Report issued in corresponding International Application No. PCT/CN2019/102114, dated Mar. 25, 2020, 4 pages.

Written Opinion of the International Searching Authority issued in corresponding International Application No. PCT/CN2019/102114, dated Mar. 25, 2020, 5 pages.

* cited by examiner

METHODS FOR FORMING THREE-DIMENSIONAL MEMORY DEVICE WITH SUPPORT STRUCTURE AND RESULTING THREE-DIMENSIONAL MEMORY DEVICE

CROSS-REFERENCE TO RELATED APPLICATIONS

This application is continuation of International Application No. PCT/CN2019/102113, filed on Aug. 23, 2019, entitled "METHODS FOR FORMING THREE-DIMENSIONAL MEMORY DEVICE WITH SUPPORT STRUCTURE AND RESULTING THREE-DIMENSIONAL MEMORY DEVICE," which claims the benefit of priority to Chinese Patent Application No. 201910522873.1, filed on Jun. 17, 2019, both of which are incorporated herein by reference in their entireties. This application is also related to U.S. application Ser. No. 16/670,579, filed on Oct. 31, 2019, entitled "THREE-DIMENSIONAL MEMORY DEVICE WITH SUPPORT STRUCTURES IN SLIT STRUCTURES AND METHOD FOR FORMING THE SAME," U.S. application Ser. No. 16/670,586, filed on Oct. 31, 2019, entitled "THREE-DIMENSIONAL MEMORY DEVICE WITHOUT GATE LINE SLITS AND METHOD FOR FORMING THE SAME," and U.S. application Ser. No. 16/670,594, filed on Oct. 31, 2019, entitled "THREE-DIMENSIONAL MEMORY DEVICE WITH SUPPORT STRUCTURES IN GATE LINE SLITS AND METHODS FOR FORMING THE SAME," all of which are hereby incorporated by reference in their entireties.

BACKGROUND

Embodiments of the present disclosure relate to methods for forming a three-dimensional (3D) memory devices using a support structure, and the resulting 3D memory devices.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A 3D memory architecture can address the density limitation in planar memory cells. 3D memory architecture includes a memory array and peripheral devices for controlling signals to and from the memory array.

SUMMARY

Embodiments of 3D memory devices and methods for forming the 3D memory devices are provided.

In one example, a 3D memory device includes a memory stack, a plurality of channel structures, a slit structure, and a source structure. The memory stack may be over a substrate and may include interleaved a plurality of conductor layers and a plurality of insulating layers extending laterally in the memory stack. The plurality of channel structures may extend vertically through the memory stack into the substrate. The plurality of channel structures and the plurality of conductor layers may intersect with one another and form a plurality of memory cells. The slit structure may extend vertically and laterally in the memory stack and divide the plurality of memory cells into at least one memory block. The slit structure may include a plurality of protruding portions and a plurality of recessed portions arranged vertically along a sidewall of the slit structure. The source structure may be in the slit structure and may include an insulating structure in contact with the slit structure and a source contact in the insulating structure and in contact with the substrate.

In another example, a 3D memory device includes a stack structure, a support structure, a plurality of first openings, and at least one stack portion. The stack structure may include interleaved a plurality of initial sacrificial layers and a plurality of initial insulating layers over a substrate. The support structure may include a plurality of support openings aligned along a lateral direction and exposing the stack structure and at least one connection portion each in contact with adjacent support openings. The plurality of first openings may be in the stack structure exposed by the plurality of support openings. The plurality of first openings may expose the substrate. The at least one stack portion may be covered by the at least one connection portion, the at least one stack portion each being in contact with adjacent first openings.

In a different example, a method for forming a 3D memory device includes forming a support structure over a stack structure. The support structure may include a patterned structure layer having a plurality of support openings aligned along a lateral direction and exposing the stack structure and at least one connection portion each in contact with adjacent support openings, and the stack structure may include interleaved a plurality of initial sacrificial layers and a plurality of initial insulating layers. The method also includes removing, using the support structure as an etch mask, portions of the stack structure exposed by the plurality of support openings to expose the substrate and form a plurality of first openings in the stack structure and at least one stack portion covered by the at least one connection portion, the at least one stack portion each being in contact with adjacent first openings. The method further includes removing the at least one stack portion to form at least one second opening under the at least one connection portion each in contact with the adjacent first openings. The plurality of first openings and the at least one second opening may form an initial slit structure that divides the stack structure into a pair of block portions. Each of the pair of block portion may include interleaved a plurality of sacrificial layers and a plurality of insulating layers.

In a further example, a method for forming a 3D memory device includes forming a support structure over a stack structure. The stack structure may include interleaved a plurality of initial sacrificial layers and a plurality of initial insulating layers and is divided into a plurality of block portions, and the support structure may include a patterned support layer having a plurality of block-masking portions covering the plurality of block portions and at least one connection portion in contact with adjacent block-masking portions. The method may also include removing, using the support structure as an etch mask, portions of the stack structure to form a plurality of first openings in the stack structure between adjacent block portions and at least one stack portion covered by the at least one connection portion, the at least one stack portion each being in contact with adjacent block portions and adjacent first openings. The method may further include removing the at least one stack portion to form an initial slit structure between the adjacent block portions, forming interleaved a plurality of conductor layers and a plurality of insulating layers in each of the plurality of block-masking portions, the at least one connection portion being over the initial slit structure and in contact with the adjacent block-masking portions. The method may further include replacing, through the initial slit structure, the plurality of sacrificial layers in each of the plurality of block portions with a plurality of conductor layers. The method may further include forming a plurality of recessed portions on the plurality of conductor layers along a sidewall of the initial slit structure to form a slit structure and a plurality of protruding portions on the plurality of insulating layers and forming a source structure in the slit structure. The source structure may be in contact with the substrate and the plurality of conductor layers and insulating layers.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1A:
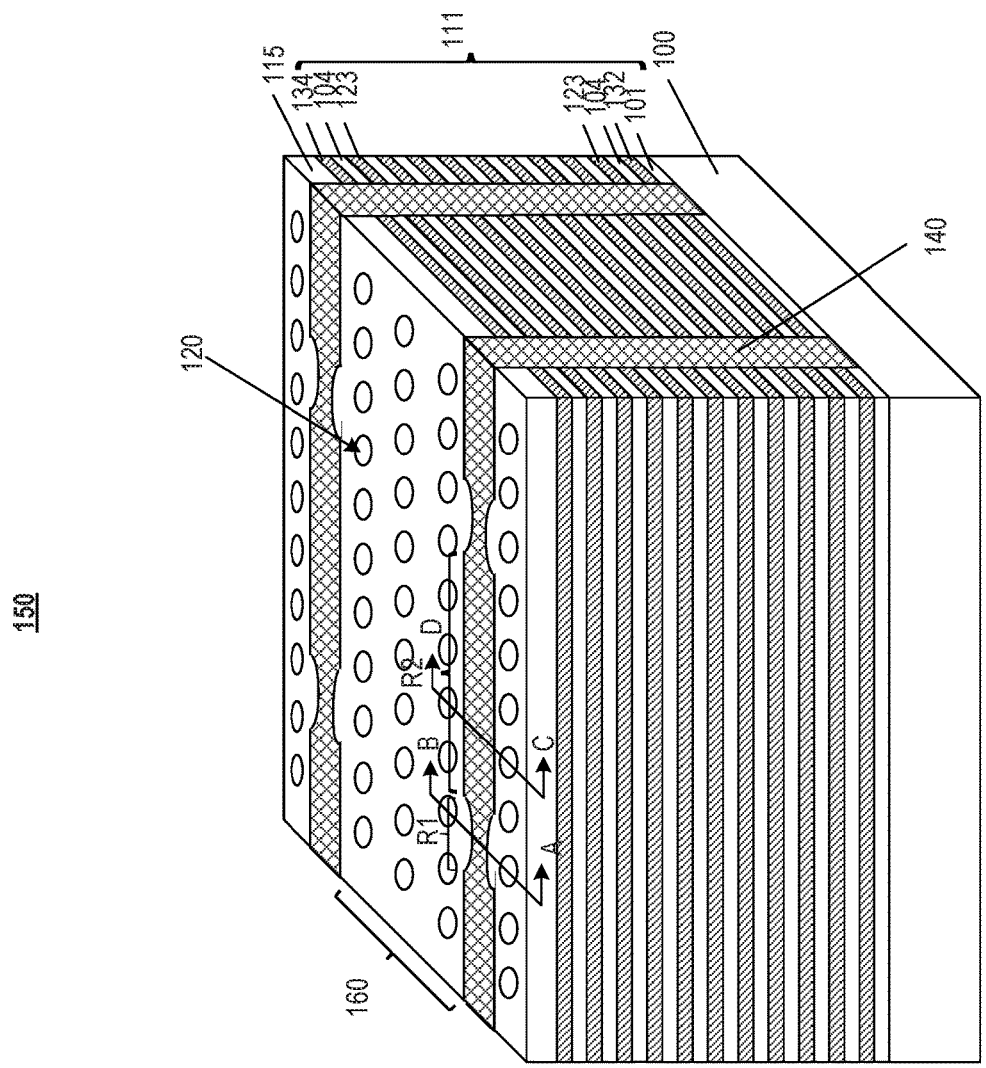
FIG. 1A illustrates an exemplary 3D memory device formed using a support structure, according to some embodiments of the present disclosure.
Figure 1A:
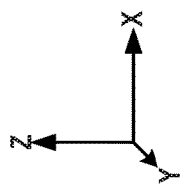

Embodiments of the present disclosure will be described with reference to the accompanying drawings.

DETAILED DESCRIPTION

Although specific configurations and arrangements are discussed, this should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to affect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, a staircase structure refers to a set of surfaces that include at least two horizontal surfaces (e.g., along x-y plane) and at least two (e.g., first and second) vertical surfaces (e.g., along z-axis) such that each horizontal surface is adjoined to a first vertical surface that extends upward from a first edge of the horizontal surface, and is adjoined to a second vertical surface that extends downward from a second edge of the horizontal surface. A "step" or "staircase" refers to a vertical shift in the height of a set of adjoined surfaces. In the present disclosure, the term "staircase" and the term "step" refer to one level of a staircase structure and are used interchangeably. In the present disclosure, a horizontal direction can refer to a direction (e.g., the x-axis or the y-axis) parallel with the top surface of the substrate (e.g., the substrate that provides the fabrication platform for formation of structures over it), and a vertical direction can refer to a direction (e.g., the z-axis) perpendicular to the top surface of the structure.

NAND flash memory devices, widely used in various electronic products, are non-volatile, light-weighted memory of low power consumption and good performance. Currently, planar NAND flash memory devices have reached its storage limit. To further increase the storage capacity and reduce the storage cost per bit, 3D NAND memory devices have been proposed. The process to form an existing 3D NAND memory device often includes the following operations. First, a stack structure of a plurality of interleaved sacrificial layers and insulating layers are formed over a substrate. A channel hole is formed extending in the stack structure. The bottom of the channel hole is etched to form a recess in the substrate. An epitaxial portion is formed at the bottom of the channel hole by selective epitaxial growth. A semiconductor channel, conductively connected to the epitaxial portion, is formed in the channel hole. The sacrificial layers can be removed and replaced with conductor layers. The conductor layers function as word lines in the 3D NAND memory device.

An existing 3D NAND memory device often includes a plurality of memory blocks. Adjacent memory blocks are often separated by a GLS, in which an array common source (ACS) is formed. In the fabrication method to form the existing 3D NAND memory device, the feature size of the GLS is susceptible to fluctuation, potentially affecting the performance of the 3D NAND memory device.

The present disclosure provides 3D memory devices (e.g., 3D NAND memory devices) formed by using a support structure in the fabrication of a slit structure (e.g., GLS) and a source structure, and methods for forming the 3D memory devices. During the fabrication of a 3D memory device, a support structure is formed over a stack structure. The support structure has a plurality of first openings that divide the stack structure into a plurality of block portions (e.g., regions in the stack structure in which memory blocks are formed). The support structure also includes a plurality of connection portions that are in contact with (i.e., connecting) portions of the support structure on both sides of the first openings. The support structure can be used as an etch mask for the formation of the slit structure. During the etching of the stack structure to form the slit structure, the support structure can provide support to the block portions of the stack structure, so as to reduce deformation of the slit structure. The support structure can be removed before or after the formation of a source structure (e.g., ACS) formed in the slit structure. The timing to remove the support structure has little or no impact on the formation of the source structure. In some embodiments, the support structure is removed after the formation of the source structure to provide support to the 3D memory device during the formation of the source structure. To further reduce the susceptibility of the slit structure to deformation, in some embodiments, the conductor layers, e.g., in the block portions and exposed by the slit structure, undergo a recess etch to form a plurality of recessed portions on the conductor layers and a plurality of protruding portions on the insulating layers. The offset between a conductor layer and adjacent insulating layers in the slit structure can improve the bonding/adhesion between the source structure (or the insulating structure of the source structure) and the slit structure (or the sidewall of the slit structure), improving the structural stability of the slit structure and the source structure). The 3D memory device is then less susceptible to deformation or damages during the fabrication process. By applying the structures and methods of the present disclosure, adjacent block portions can be connected through the support structures during the formation of slit structures and source contacts; the 3D memory device is thus less likely to deform during the fabrication process. The feature size of the slit structure is less susceptible to fluctuation.

Figure 1B:
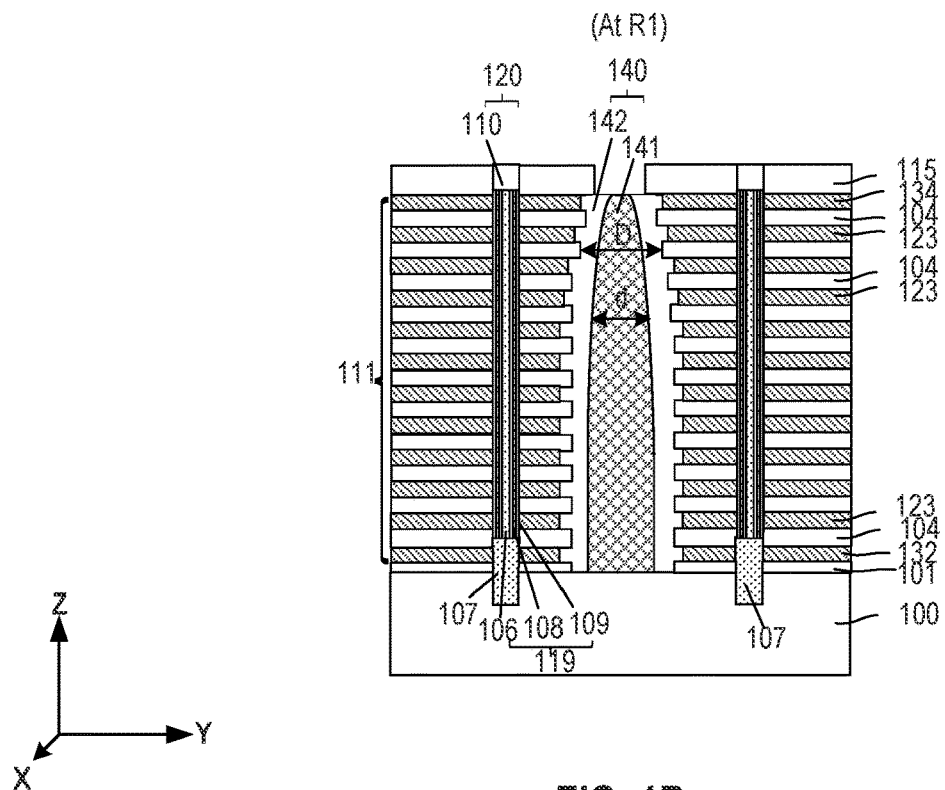
FIG. 1B illustrates a cross-sectional view of the 3D memory device illustrated in FIG. 1A along the A-B direction, according to some embodiments of the present disclosure.
Figure 1C:
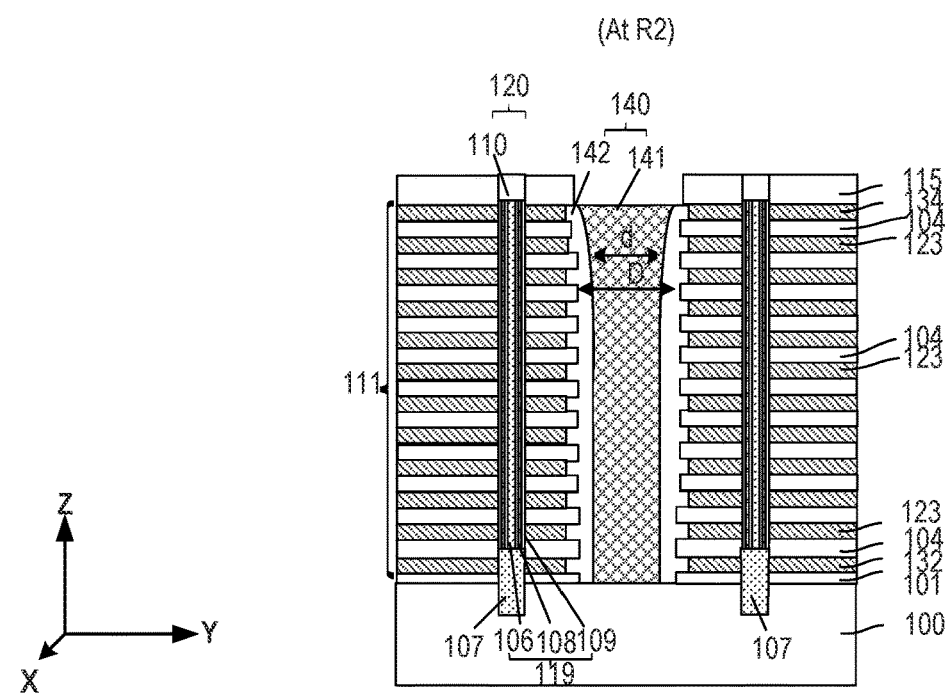
FIG. 1C illustrates a cross-sectional view of the 3D memory device illustrated in FIG. 1A along the C-D direction, according to some embodiments of the present disclosure.

FIG. 1A illustrates an exemplary 3D memory device 150, according to some embodiments. FIG. 1B illustrates a cross-sectional view of the 3D memory device 150 shown in FIG. 1A along the A-B direction. FIG. 1C illustrates a cross-sectional view of the 3D memory device 150 shown in FIG. 1A along the C-D direction.

As shown in FIGS. 1A-1C, 3D memory device 150 may include a substrate 100 and a stack structure 111 over substrate 100. 3D memory device 150 may also include one or more source structures 140 aligned along the y-direction, dividing a memory region (e.g., a region in 3D memory device 150 where memory cells are formed) of 3D memory device 150 into a plurality of block portions 160 arranged in parallel along the y-direction. Memory cells may be formed in each block portion 160, forming a memory block. In each block portion 160, stack structure 111 may include a plurality of conductor layers and a plurality of insulating layers 104 interleaved over a buffer oxide layer 101 on substrate 100. In some embodiments, the plurality of conductor layers may include a top conductor layer 134 having a plurality of top select conductor layers, a bottom conductor layer 132 having a plurality of bottom select conductor layers, and control conductor layers 123 between top conductor layer 134 and bottom conductor layer 132. Top conductor layer 134 may function as top select gate electrodes, and bottom conductor layer 132 may function as bottom select gate electrodes. 3D memory device 150 may include a buffer oxide layer 101 between substrate 100 and bottom conductor layer 132.

3D memory device 150 may also include a dielectric cap layer 115 covering the stack structure 111. In each block portion 160, 3D memory device 150 may include a plurality of channel structures 120 extending from a top surface of dielectric cap layer 115 into substrate 100 along the vertical direction (e.g., the z-direction). Each channel structure 120 may include an epitaxial portion 107 at a bottom portion, a drain structure 110 at a top portion, and a semiconductor channel 119 between epitaxial portion 107 and drain structure 110. Semiconductor channel 119 may include a memory film 109, a semiconductor layer 108, and a dielectric core 106. Epitaxial portion 107 may contact and be conductively connected to substrate 100, and semiconductor channel 119 may contact and be conductively connected to drain structure 110 and epitaxial portion 107. A plurality of memory cells may be formed by semiconductor channels 119 and control conductor layers 123. Stack structure 111 may also be referred to as a memory stack.

3D memory device 150 may include at least one source structure 140 extending vertically along the z-direction and laterally along the x-direction between block portions. Each source structure 140 may be formed in a respective slit structure and may extend from a top surface of 3D memory device 150 (e.g., a top surface of dielectric layer cap 115) through stack structure 111 and form contact with substrate 100. Source structure 140 may include an insulating structure 142 and a source contact 141 in insulating structure 142. Source contact 141 may be in contact with substrate 100 and may be insulated from conductor layers (e.g., 134, 132, and 123) in adjacent block portions 160 by respective insulating structure 142. In some embodiments, conductor layers (e.g., 134, 132, and 123) on a sidewall of the slit structure may each form a recessed portion, e.g., form an offset with adjacent insulating layers 104. Accordingly, insulating layers 104 may each form a protruding portion on the sidewall of the slit structure. In some embodiments, at one or more locations along the x-direction, a diameter D of the slit structure increases from a top surface of the slit structure towards a lower position (e.g., a middle position) of the slit structure, and a diameter d of source contact 141 increases from a top surface of source structure 140 towards a lower portion (e.g., a middle position) of source structure 140/source contact 141. Details of each structure in 3D memory device 150 are described as follows.

Substrate 100 can include silicon (e.g., single crystalline silicon), silicon germanium (SiGe), gallium arsenide (GaAs), germanium (Ge), silicon on insulator (SOI), germanium on insulator (GOI), or any other suitable materials. In some embodiments, substrate 100 is a thinned substrate (e.g., a semiconductor layer), which was thinned by grinding, etching, chemical mechanical polishing (CMP), or any combination thereof. In some embodiments, substrate 100 includes silicon.

Channel structures 120 may form an array in each block portion 160 and may each extend vertically above substrate 100. Channel structure 120 may extend through a plurality of pairs each including a conductor layer (e.g., 123, 134, or 132) and an insulating layer 104 (referred to herein as "conductor/insulating layer pairs"). At least on one side along a horizontal direction (e.g., x-direction and/or y-direction), stack structure 111 can include a staircase structure. The number of the conductor/insulating layer pairs in stack structure 111 (e.g., 32, 64, 96, or 128) determines the number of memory cells in 3D memory device 150. In some embodiments, conductor layers (e.g., 123, 132, and 134) and insulating layers 104 in stack structure 111 are alternatingly arranged along the vertical direction in block portions 160. Conductor layers (e.g., 123, 132, and 134) can include conductive materials including, but not limited to, tungsten (W), cobalt (Co), copper (Cu), aluminum (Al), polysilicon, doped silicon, silicides, or any combination thereof. Insulating layers 104 can include dielectric materials including, but not limited to, silicon oxide, silicon nitride, silicon oxynitride, or any combination thereof. In some embodiments, buffer oxide layer 101 and dielectric cap layer 115 each includes a dielectric material such as silicon oxide. In some embodiments, top conductor layer 134 includes a plurality of top select conductor layers, which function as the top select gate electrodes. Control conductor layers 123 may function as select gate electrodes and form memory cells with intersecting channel structures 120. In some embodiments, bottom conductor layer 132 includes a plurality of bottom select conductor layers, which function as the bottom select gate electrodes. Top select gate electrodes and bottom select gate electrodes can respectively be applied with desired voltages to select a desired memory block/finger/page.

As shown in FIGS. 1B and 1C, channel structure 120 can include a semiconductor channel 119 extending vertically through stack structure 111. Semiconductor channel 119 can include a channel hole filled with a channel-forming structure, e.g., semiconductor materials (e.g., as a semiconductor layer 108) and dielectric materials (e.g., as a memory film 109). In some embodiments, semiconductor layer 108 includes silicon, such as amorphous silicon, polysilicon, or single crystalline silicon. In some embodiments, memory film 109 is a composite layer including a tunneling layer, a memory layer (also known as a "charge trap layer"), and a blocking layer. The remaining space of the channel hole of semiconductor channel 119 can be partially or fully filled with a dielectric core 106 including dielectric materials, such as silicon oxide. Semiconductor channel 119 can have a cylinder shape (e.g., a pillar shape). Dielectric core 106, semiconductor layer 108, the tunneling layer, the memory layer, and the blocking layer are arranged radially from the center toward the outer surface of the pillar in this order, according to some embodiments. The tunneling layer can include silicon oxide, silicon oxynitride, or any combination thereof. The memory layer can include silicon nitride, silicon oxynitride, silicon, or any combination thereof. The blocking layer can include silicon oxide, silicon oxynitride, high dielectric constant (high-k) dielectrics, or any combination thereof. In one example, the memory layer can include a composite layer of silicon oxide/silicon oxynitride (or silicon nitride)/silicon oxide (ONO).

In some embodiments, channel structure 120 further includes an epitaxial portion 107 (e.g., a semiconductor plug) in the lower portion (e.g., at the lower end of bottom) of channel structure 120. As used herein, the "upper end" of a component (e.g., channel structure 120) is the end farther away from substrate 100 in the vertical direction, and the "lower end" of the component (e.g., channel structure 120) is the end closer to substrate 100 in the vertical direction when substrate 100 is positioned in the lowest plane of 3D memory device 150. Epitaxial portion 107 can include a semiconductor material, such as silicon, which is epitaxially grown from substrate 100 in any suitable directions. It is understood that in some embodiments, epitaxial portion 107 includes single crystalline silicon, the same material as substrate 100. In other words, epitaxial portion 107 can include an epitaxially-grown semiconductor layer grown from substrate 100. Epitaxial portion 107 can also include a different material than substrate 100. In some embodiments, epitaxial portion 107 includes at least one of silicon, germanium, and silicon germanium. In some embodiments, part of epitaxial portion 107 is above the top surface of substrate 100 and in contact with semiconductor channel 119. Epitaxial portion 107 may be conductively connected to semiconductor channel 119. In some embodiments, a top surface of epitaxial portion 107 is located between a top surface and a bottom surface of a bottom insulating layer 104 (e.g., the insulating layer at the bottom of stack structure 111).

In some embodiments, channel structure 120 further includes drain structure 110 (e.g., channel plug) in the upper portion (e.g., at the upper end) of channel structure 120. Drain structure 110 can be in contact with the upper end of semiconductor channel 119 and may be conductively connected to semiconductor channel 119. Drain structure 110 can include semiconductor materials (e.g., polysilicon) or conductive materials (e.g., metals). In some embodiments, drain structure includes an opening filled with Ti/TiN or Ta/TaN as an adhesion layer and tungsten as a conductor material. By covering the upper end of semiconductor channel 119 during the fabrication of 3D memory device 150, drain structure 110 can function as an etch stop layer to prevent etching of dielectrics filled in semiconductor channel 119, such as silicon oxide and silicon nitride.

In some embodiments, source structure 140 includes a source contact 141 in an insulating structure 142, extending laterally along the x-direction. Source contact 141 may be in contact with and form a conductive connection with substrate 100 for applying a source voltage on memory cells. In some embodiments, source contact 141 includes one or more of polysilicon, silicides, germanium, silicon germanium, copper, aluminum, cobalt, and tungsten. In some embodiments, insulating structure 142 includes one or more of silicon oxide, silicon nitride, and silicon oxynitride.

Each source structure 140 may be formed in the respective slit structure that extends along the same vertical and lateral directions along which source structure 140 extends. In some embodiments, a sidewall of the slit structure may include a plurality of protruding portions and a plurality of recessed portions. Each protruding portion may be sandwiched by two adjacent recessed portions, and vice versa. The protruding portions may be formed on insulating layers 104. The recessed portions may be formed on conductor layers (e.g., 134, 132, and 123). An offset is formed between a protruding portion (or insulating layer 104) and an adjacent recessed portion (or conductor layer (132, 134, or 123) on the sidewall of the slit structure. Insulating structure 142 may be in contact with the protruding portions and/or the recessed portions. In some embodiments, insulating structure 142 is in contact with both the protruding portions and the recessed portions.

Along the lateral direction in which it extends, e.g., the x-direction, a width of the slit structure and/or source structure 140 may vary. FIG. 1B illustrates a cross-sectional view of source structure 140 and surrounding structures along the A-B direction. FIG. 1C illustrates a cross-sectional view of source structure 140 and surrounding structures along the C-D direction. The A-B direction may be at a first location and FIG. 1B illustrates a cross-sectional view of gate structure 140 at the first location along the x-direction. The C-D direction may be at a second location and FIG. 1C illustrates a cross-sectional view of source structure 140 at the second location along the x-direction. At the first location, a width D of source structure 140 (or the slit structure) along the y-direction may increase from the top portion of source structure (or the slit structure) towards a lower portion of source structure 140 (or the slit structure). In some embodiments, a width d of source contact 141 along the y-direction may increase from the top portion of source contact 141 towards a lower portion of source contact 141. At the second location, a width of source structure 140 (or the slit structure) along the y-direction may decrease from the top portion of source structure (or the slit structure) towards a lower portion of source structure 140 (or the slit structure). In some embodiments, width D of source structure 140 along the y-direction may decrease from the top portion of source structure 140 towards a lower portion of source structure 140, and width d of source contact 141 may decrease from the top portion of source contact 141 towards a lower portion of source contact 141. The variation of widths of the slit structure, source structure 140, and/or source contact 141 may be caused by the use of support structure during the fabrication of the slit structure and source structure 140. In some embodiments, portions of dielectric cap layer 115 covered by the support structure during the fabrication process may not be completely removed along the y-direction for the formation of the slit structure. Accordingly, the removal of portions of stack structure 111 under dielectric cap layer 115 may increase (e.g., be removed more completely) from the top portion of the slit structure towards a lower portion of the slit structure, forming the slit structure with increasing width along the z-direction towards substrate 100.

Along the x-direction, a distance range of the slit structure formed under the coverage of the support structure may be referred to as a first distance range R1, and a distance range of the slit structure formed without the coverage of the support structure may be referred to as a second distance range R2. In some embodiments, one slit structure extends along at least one first distance range R1 and at least one second distance range R2 along the x-direction. In some embodiments, in first distance range R1, the width of the slit structure along the y-direction increases from the top surface of the slit structure to at least a middle portion of the slit structure and width d of source contact 141 increases from the top surface of source contact 141 to at least the middle portion of source contact 141. In some embodiments, in second distance range R2, the width of slit structure along the y-direction decreases from the top surface of the slit structure to the middle portion of the slit structure and width d of source contact 141 decreases from the top surface of source contact 141 to the middle portion of source contact 141. As shown in FIG. 1A, the boundaries of the slit structure may have an arch shape, e.g., extending inwardly along the x-y plane in first distance range R1, while extend in parallel in second distance range R2. In some embodiments, first distance ranges R1 in different slit structures may be aligned along the y-direction, and second distance ranges R2 in different slit structures may be aligned along the y-direction.

In some embodiments, width d of source contact and width D of source structure 140 or the slit structure may each be nominally uniform along the z-direction. That is, the use of the support structure during the fabrication of 3D memory device 150 may have little or no impact on the dimensions of the slit structure and/or source contact 141. Whether there is noticeable variation in the widths of source structure 140, slit structure, and source contact 141 should not be limited by the embodiments of the present disclosure.

3D memory device 150 can be part of a monolithic 3D memory device. The term "monolithic" means that the components (e.g., the peripheral device and memory array device) of the 3D memory device are formed on a single substrate. For monolithic 3D memory devices, the fabrication encounters additional restrictions due to the convolution of the peripheral device processing and the memory array device processing. For example, the fabrication of the memory array device (e.g., NAND channel structures) is constrained by the thermal budget associated with the peripheral devices that have been formed or to be formed on the same substrate.

Alternatively, 3D memory device 150 can be part of a non-monolithic 3D memory device, in which components (e.g., the peripheral device and memory array device) can be formed separately on different substrates and then bonded, for example, in a face-to-face manner. In some embodiments, the memory array device substrate (e.g., substrate 100) remains as the substrate of the bonded non-monolithic 3D memory device, and the peripheral device (e.g., including any suitable digital, analog, and/or mixed-signal peripheral circuits used for facilitating the operation of 3D memory device 150, such as page buffers, decoders, and latches; not shown) is flipped and faces down toward the memory array device (e.g., NAND memory strings) for hybrid bonding. It is understood that in some embodiments, the memory array device substrate (e.g., substrate 100) is flipped and faces down toward the peripheral device (not shown) for hybrid bonding, so that in the bonded non-monolithic 3D memory device, the memory array device is above the peripheral device. The memory array device substrate (e.g., substrate 100) can be a thinned substrate (which is not the substrate of the bonded non-monolithic 3D memory device), and the back-end-of-line (BEOL) interconnects of the non-monolithic 3D memory device can be formed on the backside of the thinned memory array device substrate.

Figure 8A:
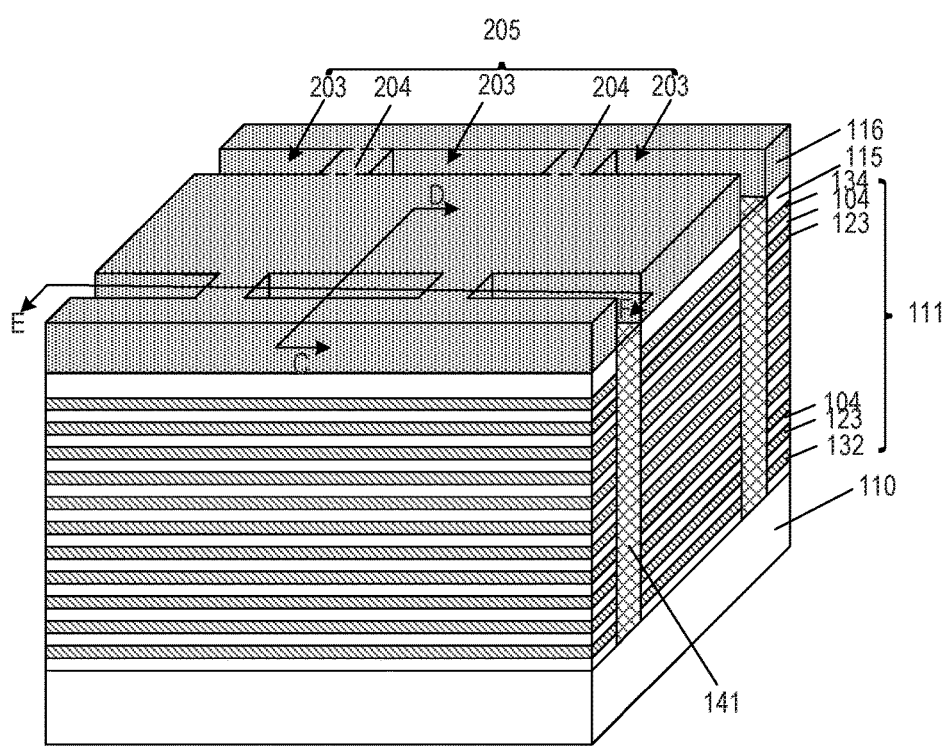
FIG. 8A illustrates an exemplary 3D memory device at another stage of the fabrication process, according to some embodiments of the present disclosure.
Figure 8B:
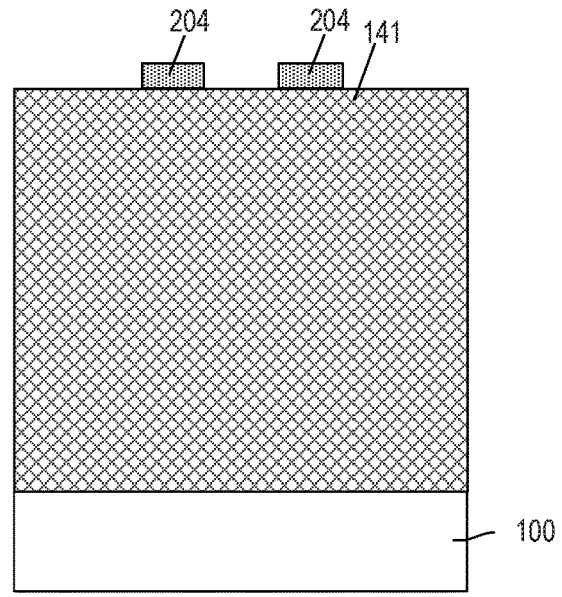
FIG. 8B illustrates a cross-sectional view of the 3D memory device illustrated in FIG. 8A along the E-F direction, according to some embodiments of the present disclosure.
Figure 8C:
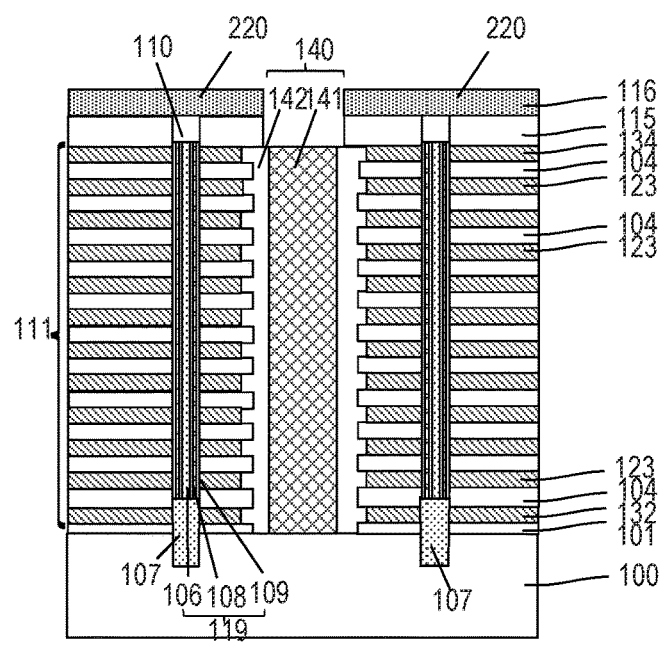
FIG. 8C illustrates a cross-sectional view of the 3D memory device illustrated in FIG. 8A along the C-D direction, according to some embodiments of the present disclosure.
Figure 9:
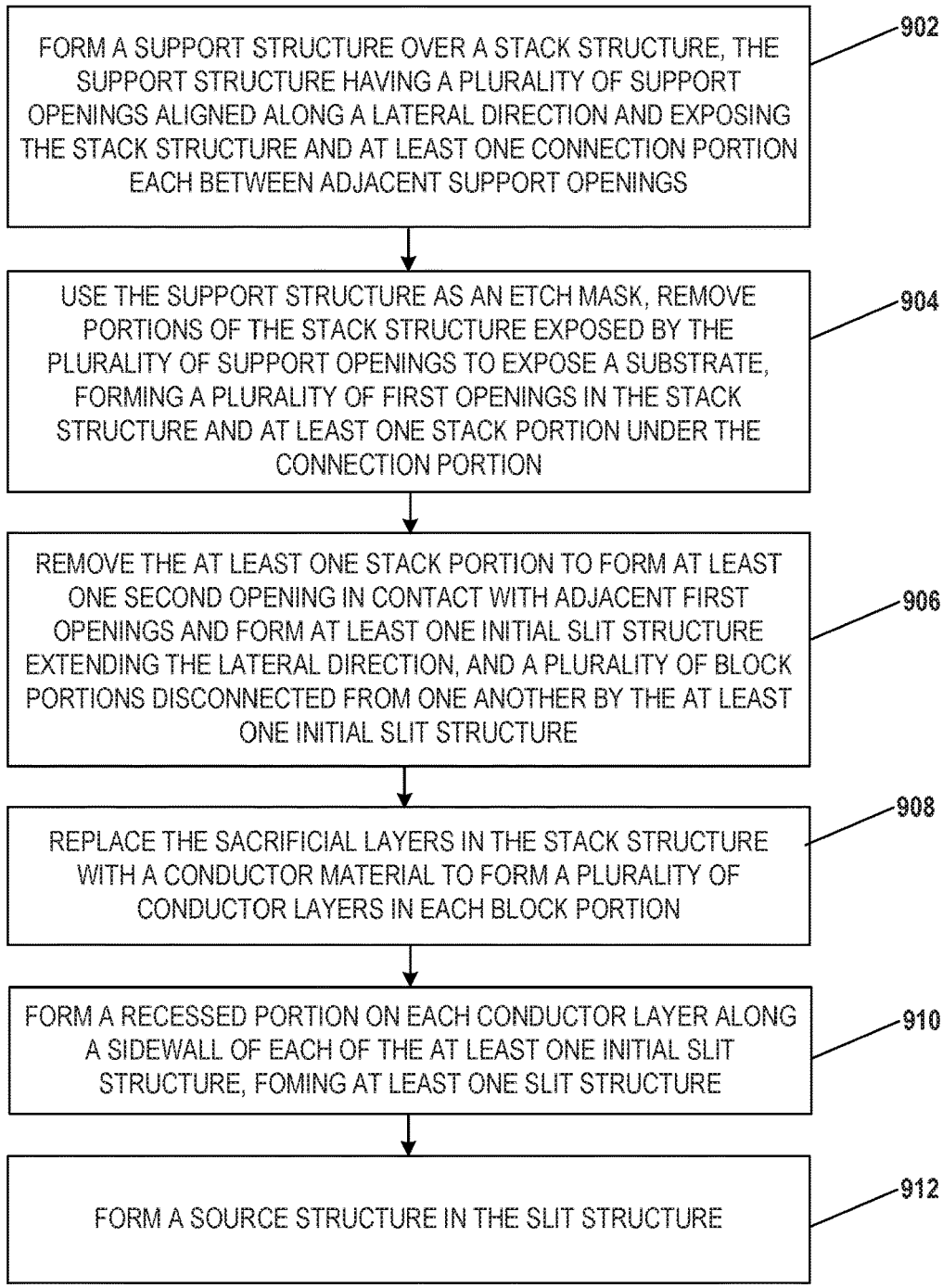
FIG. 9 illustrates a flowchart of an exemplary fabrication process for forming a 3D memory device using a support structure, according to some embodiments of the present disclosure.

FIGS. 2-8 illustrate a fabrication process to form 3D memory device 150, and FIG. 9 illustrates a flowchart 900 of the fabrication process, according to some embodiments.

At the beginning of the process, a support structure is formed over a stack structure (Operation 902). The stack structure includes interleaved a plurality of initial insulating layers and a plurality of initial sacrificial layers). The support structure includes a plurality of support openings aligned along a lateral direction and exposing the stack structure. The support structure also includes at least one connection portion each between and in contact with adjacent support openings. FIGS. 2-3 illustrate corresponding structures 250 and 300.

As shown in FIGS. 2A-2B and 3A-3D, a stack structure 111 having a dielectric stack of interleaved initial insulating layers 104i and initial sacrificial layers 103i is formed over a substrate 100. Initial sacrificial layers 103i may be used for subsequent formation of conductor layers 123, 132, and 134. Initial insulating layers 104i may be used for subsequent formation of insulating layers 104. In some embodiments, stack structure 111 includes a dielectric cap layer 115 over initial sacrificial layers 103i and initial insulating layers 104i.

Stack structure 111 may have a staircase structure along the x-direction and/or the y-direction (not shown in the figures). The staircase structure can be formed by repetitively etching a material stack that includes a plurality of interleaved sacrificial material layers and insulating material layers using an etch mask, e.g., a patterned PR layer over the material stack. The interleaved sacrificial material layers and the insulating material layers can be formed by alternatingly depositing layers of sacrificial material and layers of insulating material over buffer oxide layer 101 until a desired number of layers is reached. In some embodiments, a sacrificial material layer is deposited over buffer oxide layer 101, and an insulating material layer is deposited over the sacrificial material layer, so on and so forth. The sacrificial material layers and insulating material layers can have the same or different thicknesses. In some embodiments, a sacrificial material layer and the underlying insulating material layer are referred to as a dielectric pair. In some embodiments, one or more dielectric pairs can form one level/staircase. During the formation of the staircase structure, the PR layer is trimmed (e.g., etched incrementally and inwardly from the boundary of the material stack, often from all directions) and used as the etch mask for etching the exposed portion of the material stack. The amount of trimmed PR can be directly related (e.g., determinant) to the dimensions of the staircases. The trimming of the PR layer can be obtained using a suitable etch, e.g., an isotropic dry etch such as a wet etch. One or more PR layers can be formed and trimmed consecutively for the formation of the staircase structure. Each dielectric pair can be etched, after the trimming of the PR layer, using suitable etchants to remove a portion of both the sacrificial material layer and the underlying insulating material layer. The etched sacrificial material layers and insulating material layers may form initial sacrificial layers 103i and initial insulating layers 104i. The PR layer can then be removed.

The insulating material layers and sacrificial material layers may have different etching selectivities during the subsequent gate-replacement process. In some embodiments, the insulating material layers and the sacrificial material layers include different materials. In some embodiments, the insulating material layers include silicon oxide, and the deposition of insulating material layers include one or more of chemical vapor deposition (CVD), atomic layer deposition (ALD), physical vapor deposition (PVD), and sputtering. In some embodiments, the sacrificial material layers include silicon nitride, and the deposition of insulating material layers include one or more of CVD, PVD, ALD, and sputtering. In some embodiments, the etching of the sacrificial material layers and the insulating material layers include one or more suitable anisotropic etching process, e.g., dry etch.

A plurality of channel structures 120 may be formed in stack structure 111. A plurality of channel holes may be formed extending vertically through stack structure 111. In some embodiments, a plurality of channel holes are formed through the interleaved initial sacrificial layers 103i and initial insulating layers 104i. The plurality of channel holes may be formed by performing an anisotropic etching process, using an etch mask such as a patterned PR layer, to remove portions of stack structure 111 and expose substrate 100. In some embodiments, a plurality of channel holes are formed in each block portion 160. A recess region may be formed at the bottom of each channel hole to expose a top portion of substrate 100 by the same etching process that forms the channel hole above substrate 100 and/or by a separate recess etching process. In some embodiments, a semiconductor plug is formed at the bottom of each channel hole, e.g., over the recess region. The semiconductor plug may be formed by an epitaxial growth process and/or a deposition process. In some embodiments, the semiconductor plug is formed by epitaxial growth and is referred to as epitaxial portion 107. Optionally, a recess etch process (e.g., dry etch and/or wet etch) may be performed to remove excess semiconductor material on the sidewall of the channel hole and/or control the top surface of epitaxial portion 107 at a desired position. In some embodiments, the top surface of epitaxial portion 107 is located between the top and bottom surfaces of the bottom initial insulating layer 104i.

In some embodiments, the channel holes are formed by performing a suitable etching process, e.g., an anisotropic etching process (e.g., dry etch) and/or an isotropic etching process (wet etch). In some embodiments, epitaxial portion 107 includes single crystalline silicon and is formed by epitaxially grown from substrate 100. In some embodiments, epitaxial portion 107 includes polysilicon formed by a deposition process. The formation of epitaxially-grown epitaxial portion 107 can include, but not limited to, vapor-phase epitaxy (VPE), liquid-phase epitaxy (LPE), molecular-beam epitaxy (MPE), or any combinations thereof. The formation of epitaxial portion 107 may include, but not limited by, CVD, PVD, and/or ALD.

In some embodiments, a semiconductor channel 119 is formed over and contacting epitaxial portion 107 in the channel hole. Semiconductor channel can include a channel-forming structure that has a memory film 109 (e.g., including a blocking layer, a memory layer, and a tunneling layer), a semiconductor layer 108 formed above and connecting epitaxial portion 107, and a dielectric core 106 filling up the rest of the channel hole. In some embodiments, memory film 109 is first deposited to cover the sidewall of the channel hole and the top surface of epitaxial portion 107, and semiconductor layer 108 is then deposited over memory film 109 and above epitaxial portion 107. The blocking layer, memory layer, and tunneling layer can be subsequently deposited in this order using one or more thin film deposition processes, such as ALD, CVD, PVD, any other suitable processes, or any combination thereof, to form memory film 109. Semiconductor layer 108 can then be deposited on the tunneling layer using one or more thin film deposition processes, such as ALD, CVD, PVD, any other suitable processes, or any combination thereof. In some embodiments, dielectric core 106 is filled in the remaining space of the channel hole by depositing dielectric materials after the deposition of semiconductor layer 108, such as silicon oxide.

In some embodiments, drain structure 110 is formed in the upper portion of each channel hole. In some embodiments, parts of memory film 109, semiconductor layer 108, and dielectric core 106 on the top surface of stack structure 111 and in the upper portion of each channel hole can be removed by CMP, grinding, wet etching, and/or dry etching to form a recess in the upper portion of the channel hole so that a top surface of semiconductor channel may be between the top surface and the bottom surface of dielectric cap layer 115. Drain structure 110 then can be formed by depositing conductive materials, such as metals, into the recess by one or more thin film deposition processes, such as CVD, PVD, ALD, electroplating, electroless plating, or any combination thereof. A channel structure 120 is thereby formed. A plurality of memory cells may subsequently be formed by the intersection of semiconductor channels 119 and control conductor layers 123. Optionally, a planarization process, e.g., dry/wet etch and/or CMP, is performed to remove any excess material on the top surface of stack structure 111.

Figure 2A:
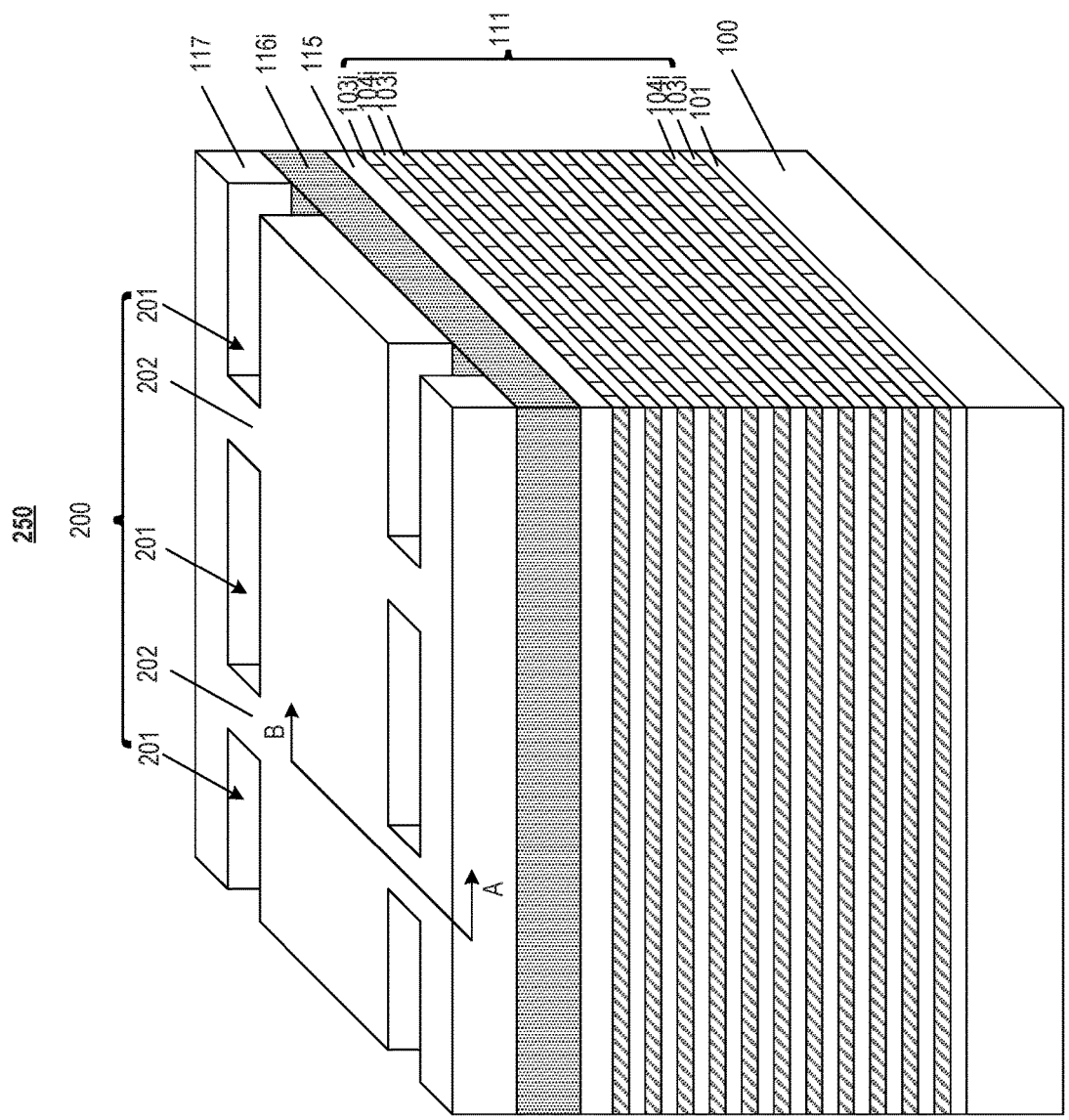
FIG. 2A illustrates an exemplary 3D memory device at one stage of a fabrication process, according to some embodiments of the present disclosure.
Figure 2B:
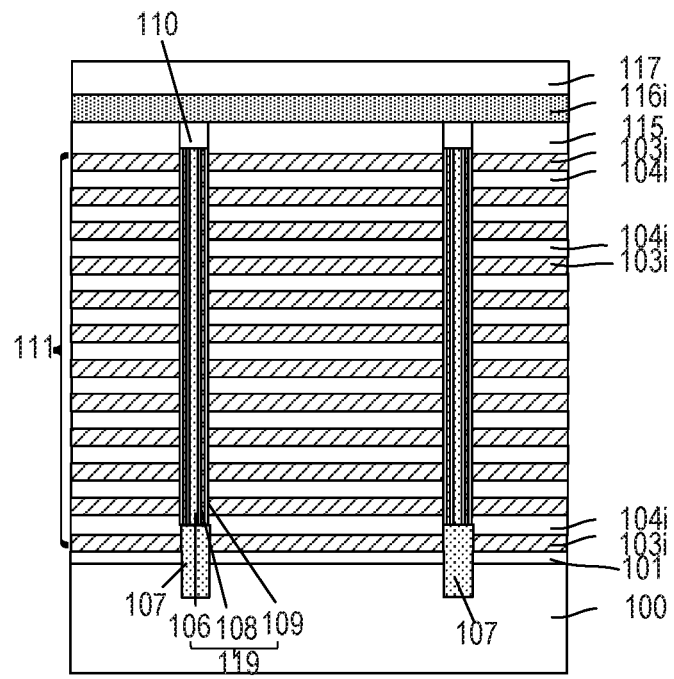
FIG. 2B illustrates a cross-sectional view of the 3D memory device illustrated in FIG. 2A along the A-B direction, according to some embodiments of the present disclosure.
Figure 2B:
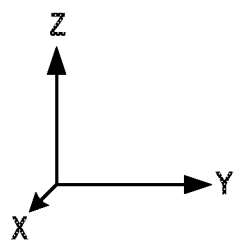
Figure 3A:
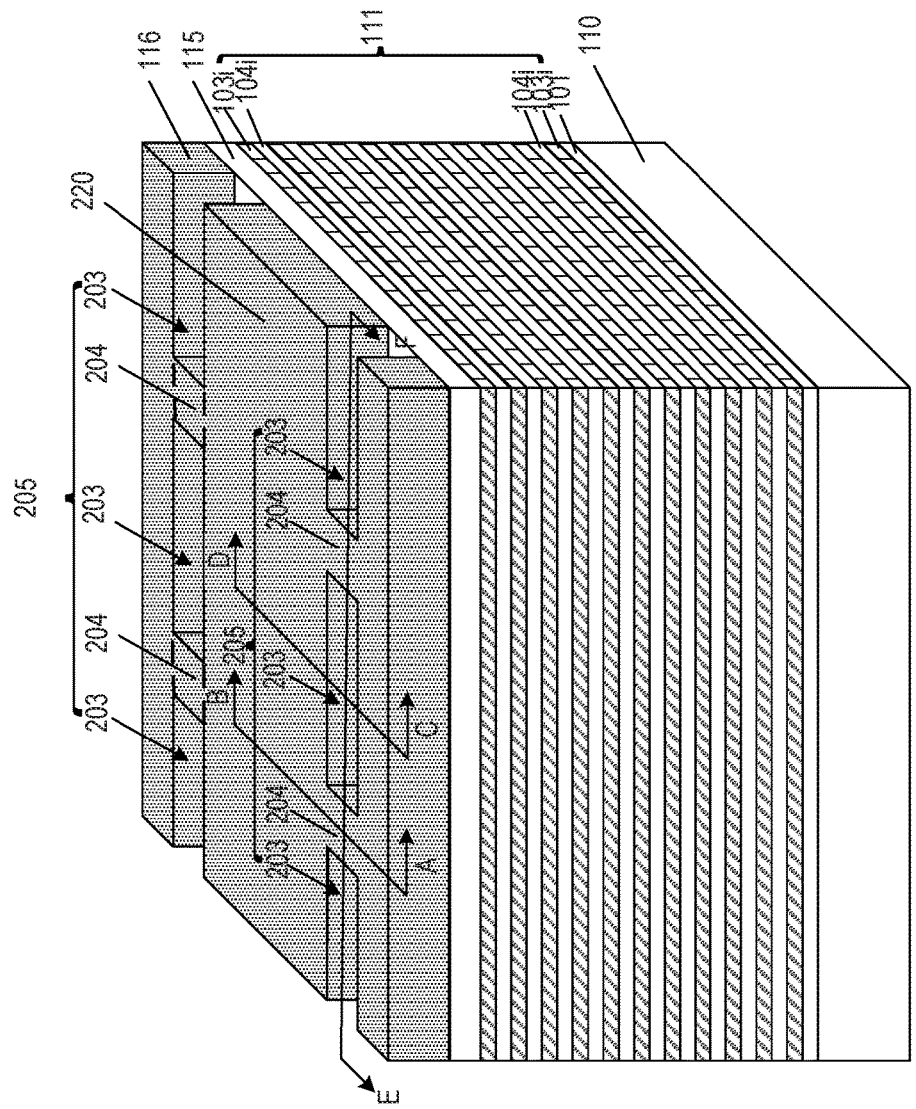
FIG. 3A illustrates an exemplary 3D memory device at another stage of a fabrication process, according to some embodiments of the present disclosure.
Figure 3A:
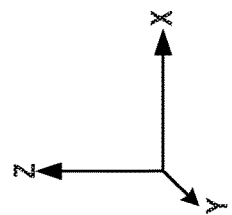
Figure 3B:
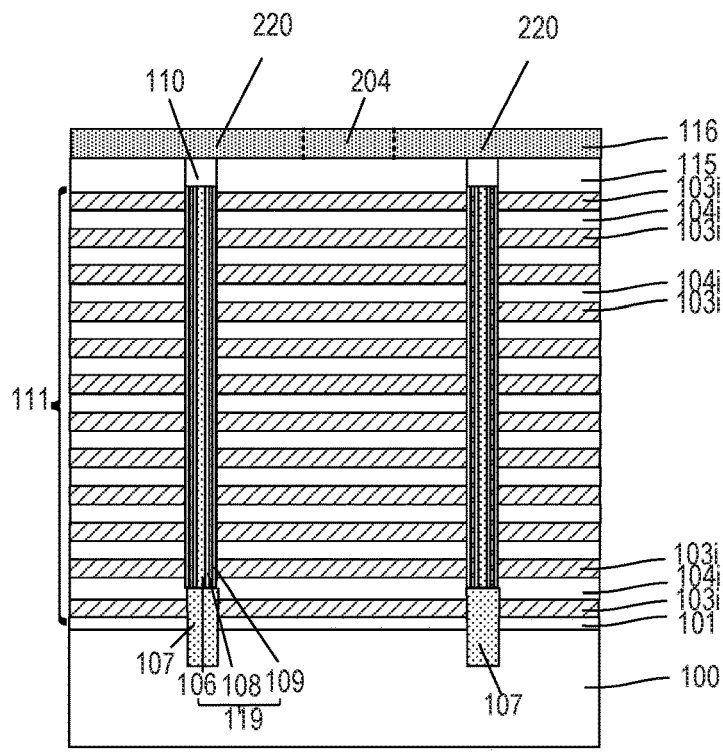
FIG. 3B illustrates a cross-sectional view of the 3D memory device illustrated in FIG. 3A along the A-B direction, according to some embodiments of the present disclosure.
Figure 3C:
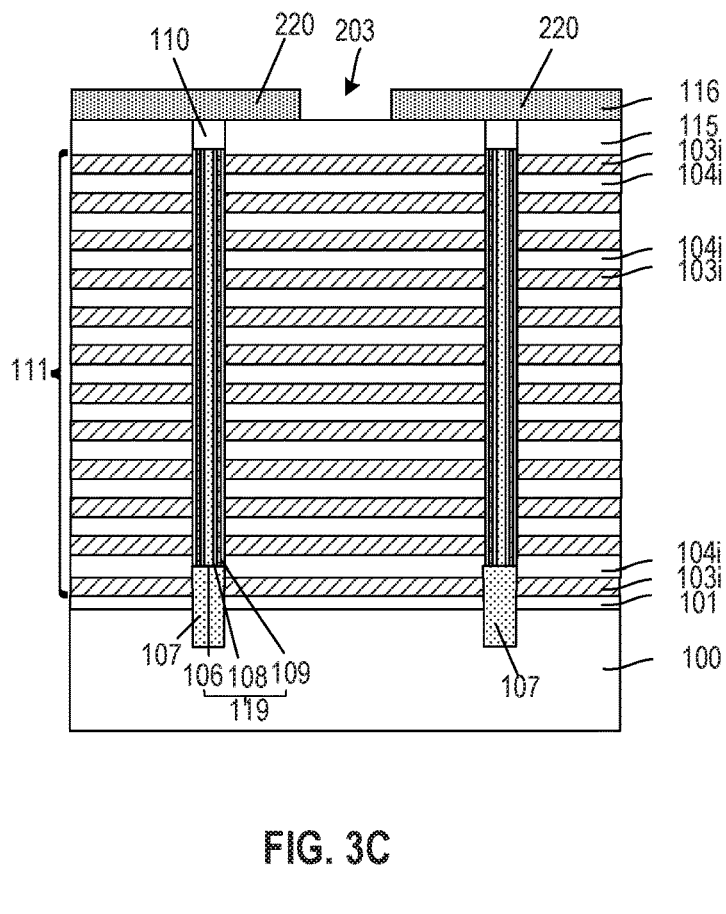
FIG. 3C illustrates a cross-sectional view of the 3D memory device illustrated in FIG. 3A along the C-D direction, according to some embodiments of the present disclosure.
Figure 3D:
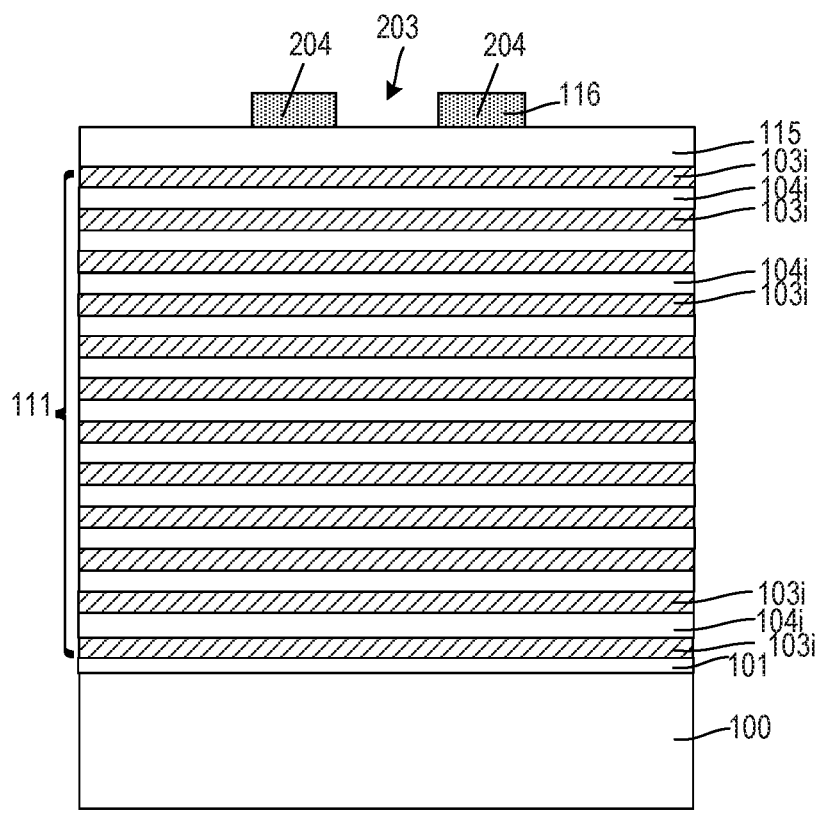
FIG. 3D illustrates a cross-sectional view of the 3D memory device illustrated in FIG. 3A along the E-F direction, according to some embodiments of the present disclosure.

As shown in FIGS. 2A and 2B, a support layer 116i can be formed over stack structure 111. Support layer 116i may include a material different from initial sacrificial layers 103i and initial insulating layers 104i. In some embodiments, support layer 116i includes one or more of polysilicon, silicon germanium, and silicon carbide. Support layer 116i may be formed by CVD, PVD, ALD, and/or sputtering. In some embodiments, support layer 116i includes polysilicon and is formed by CVD. In some embodiments, support layer 116i includes the same material as initial insulating layers 104i. Support layer 116i may include a single-layer structure or a multi-layer structure. For example, support layer 116i can include more than one material in a multi-layer structure. In some embodiments, a plurality of pits (e.g., recessed areas) are formed on the top surface of stack structure 111 (e.g., top surface of dielectric cap layer 115). The formation of support layer 116i may fill the pits with the material of support layer 116i, increasing the bonding between support layer 116i and stack structure 111. In the subsequent formation of slit structures, the support structure (e.g., formed based on support layer 116i) can more effectively support the 3D memory device, improving the structural stability of the 3D memory device. The pits may be formed by any suitable method such as wet etch.

A patterned mask layer 117 may be formed over support layer 116i. Patterned mask layer 117 may include a patterned photoresist layer, formed by spinning on a layer of photoresist layer on support layer 116i and patterning it with a photolithography process. Patterned mask layer 117 may include a plurality of mask openings 201 aligned along the x-direction and at least one mask portion 202 in contact with (e.g., connecting) adjacent mask openings 201. Mask openings 201 may expose support layer 116i and mask portions 202 may cover portions of support layer 116i. The area and locations of mask openings 201 may correspond to the area and locations of support openings subsequently formed in the fabrication process, and the area and locations of mask portions 202 may correspond to the area and locations of connection portions subsequently formed in the fabrication process. Mask openings 201 and mask portions 202 aligned along the x-direction may form a mask pattern 200, which corresponds to the area and location of a slit structure subsequently formed in the fabrication process. In some embodiments, a plurality of mask patterns 200 may be formed, extending along the x-direction and being arranged parallel along the y-direction.

As shown in FIGS. 3A-3D, patterned mask layer 117 may be used as an etch mask to remove portions of support layer 116i and expose stack structure 111. A support structure 116, having a plurality of support openings 203 and at least one connection portion 204, may be formed. Each connection portion 204 may cover a portion of stack structure 111 (e.g., cover a portion of the top surface of dielectric cap layer 115). One or more support openings 203 may be aligned along the x-direction, and at least one connection portion 204 may each be in contact with (e.g., connecting) adjacent support openings 203. The support openings 203 and connection portions 204 aligned along the x-direction may form a support pattern 205, which corresponds to the location and area of the subsequently-formed slit structure. Optionally, patterned mask layer 117 is removed after the formation of support openings 203 and connection portions 204. A suitable etching process, e.g., dry and/or wet etch, can be performed to form support pattern 205. In some embodiments, each support pattern 205 includes at least two support openings 203 and at least one connection portion 204. In some embodiments, structure 300 includes at least two support patterns 205 arranged in parallel along the y-direction. The number of support openings 203 and connection portions 204 in each support pattern 205 should be determined based on the design and fabrication process (e.g., the area of the memory region and/or the length of the slit structure) and should not be limited by the embodiments of the present disclosure. In some embodiments, a support portion 220, of support structure 116, between adjacent support patterns 205 may correspond to the location and area of subsequently formed block portion 160. In some embodiments, connection portions 204 of different support patterns 205 may be aligned along the y-direction. Referring back to FIG. 1A, connection portions 204 may be formed in (or may cover) first distance ranges R1, and support openings 203 may be formed in (or may cover) second distance ranges R2.

Figure 4A:
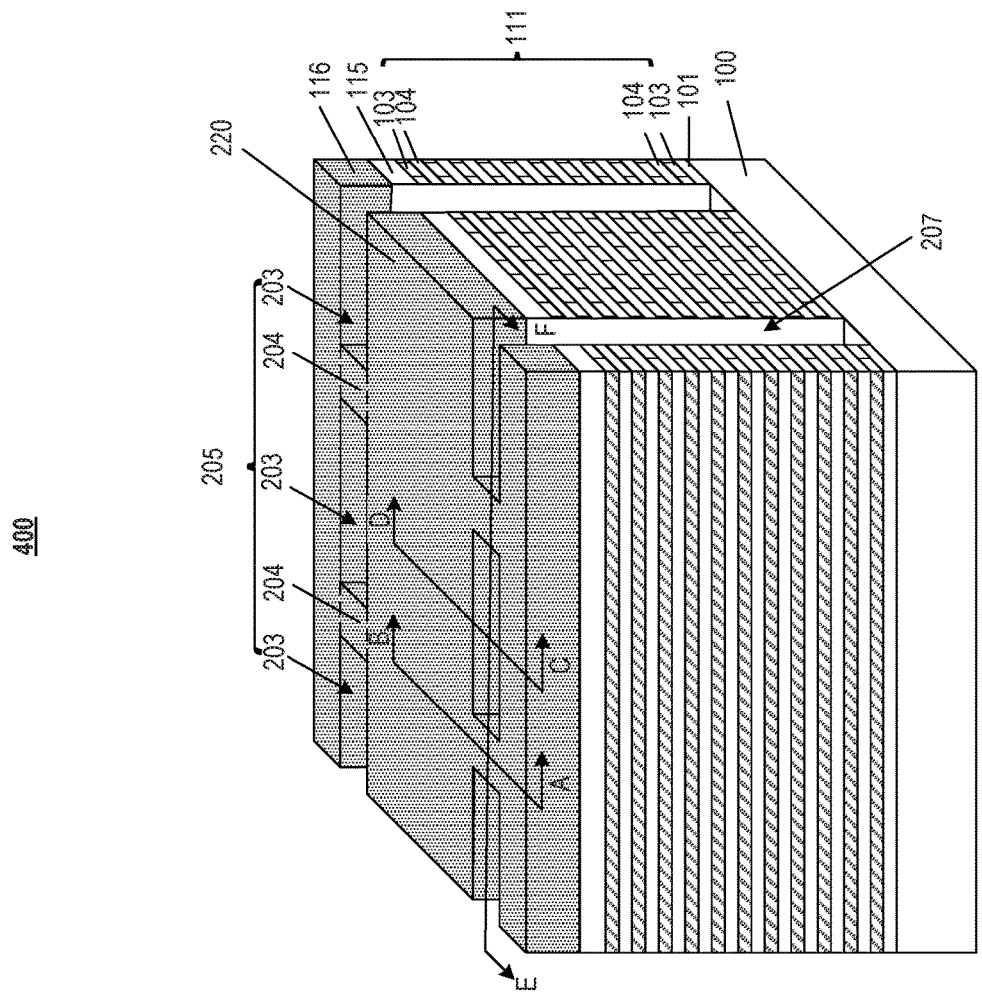
FIG. 4A illustrates an exemplary 3D memory device at another stage of the fabrication process, according to some embodiments of the present disclosure.
Figure 4B:
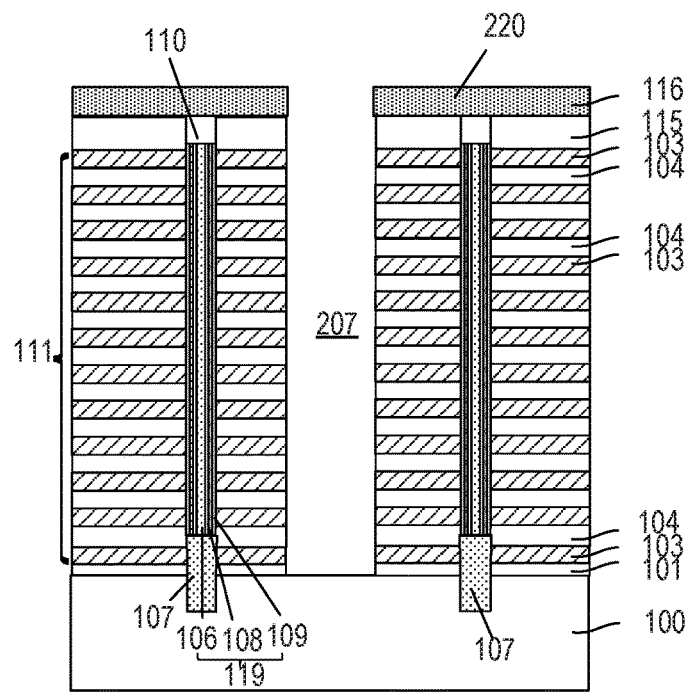
FIG. 4B illustrates the cross-sectional view of the 3D memory device illustrated in FIG. 4A along the C-D direction, according to some embodiments of the present disclosure.
Figure 4C:
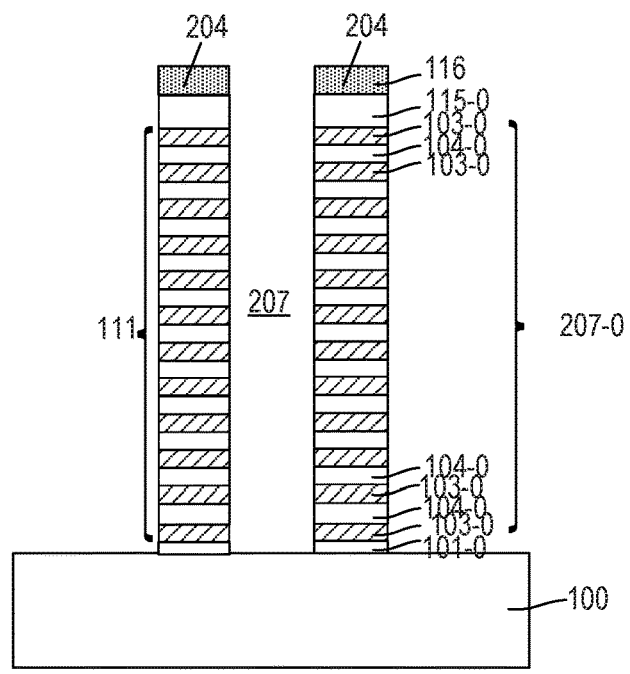
FIG. 4C illustrates the cross-sectional view of the 3D memory device illustrated in FIG. 4A along the E-F direction, according to some embodiments of the present disclosure.

Referring back to FIG. 9, after the formation of the support structure, the support structure is used as an etch mask to remove portions of the stack structure and form a plurality of first openings in the stack structure and at least one stack portion under the connection portion (Operation 904). FIGS. 4A-4C illustrate a corresponding structure 400.

As shown in FIGS. 4A-4C, support structure 116 may be used as an etch mask to remove portions of stack structure 111 exposed by support openings 203 to expose substrate 100, forming a plurality of first openings 207 in stack structure 111. A stack portion 207-0 may also be formed under each connection portion 204. At least two first openings 207 may be aligned along the x-direction and extend vertically and laterally in stack structure 111. Connection portion 204 may be in contact with (e.g., connecting) adjacent first openings 207. In some embodiments, dielectric cap layer 115 and buffer oxide layer 101 may also be patterned to form a dielectric cap portion 115-0 and a buffer oxide portion 101-0 in stack portion 207-0. Referring back to FIG. 1A, stack portions 207-0 may be formed in (or may cover) first distance ranges R1, and first openings 207 may be formed in (or may cover) second distance ranges R2.

A stack portion 207-0 may include interleaved a plurality of sacrificial portions 103-0 and a plurality of insulating portions 104-0, stacking between substrate 100 (or buffer oxide portion 101-0) and connection portion 204 (or dielectric cap portion 115-0). Sacrificial portions 103-0 and insulating portions 104-0 may be formed by removing portions of initial sacrificial layers 103i and initial insulating layers 104i exposed by support openings 203. The remaining portions of initial sacrificial layers 103i and initial insulating layers 104i separated by first openings 207 may respectively form sacrificial layers 103 and insulating layers 104. In some embodiments, each sacrificial portion 103-0 may be in contact with adjacent sacrificial layers 103 and each insulating portion 104-0 may be in contact with adjacent insulating layer 104. In some embodiments, an anisotropic etching process, e.g., dry etch, is performed to form first openings 207. The etchant of the anisotropic etching process may selectively etch initial sacrificial layers 103i, initial insulating layers 104i, dielectric cap layer 115, and buffer oxide layer 101 over support structure 116. For example, the dry etch may include a plasma etching process, and the etchant may include fluorine-containing gases.

Referring back to FIG. 9, after the formation of first openings and stack portions, the stack portions are removed to form at least one second opening in contact with adjacent first openings and form at least one initial slit structure and a plurality of block portions (Operation 906). FIGS. 5A-5C and 6A-6C illustrate corresponding structures 500 and 600.

As shown in FIGS. 5A-5C and 6A-6C, sacrificial portions 103-0 and insulating portions 104-0 in stack portion 207-0 may be respectively removed. In some embodiments, dielectric cap portion 115-0 and buffer oxide portion 101-0 are also removed, e.g., together with insulating portions 104-0. A second opening 208 (e.g., illustrated in FIG. 6A) can be formed under each connection portion 204. Second opening 208 may be in contact with (e.g., connecting) adjacent first openings 207 to form an initial slit structure 209. In some embodiments, initial slit structure 209 extend laterally along the x-direction and vertically through stack structure 111. The portion of stack structure 111 between adjacent initial slit structures 209 form a block portion 160. In some embodiments, more than one initial slit structures 209 and a plurality of block portions 160 are formed. The plurality of block portions 160 may be disconnected from one another by the more than one initial slit structures 209. Each block portion 160 may include interleaved a plurality of sacrificial layers 103 and a plurality of insulating layers 104.

The order to remove sacrificial portions 103-0 and insulating portions 104-0 in stack portion 207-0 may be dependent on the fabrication process, e.g., the order and type of etchant used in the etching operation, and should not be limited by the embodiments of the present disclosure. FIGS. 5 and 6 illustrate an example in which sacrificial portions 103-0 are removed before the removal of insulating portions 104-0. In some embodiments, insulating portions 104-0 are removed before the removal of sacrificial portions 103-0. In some embodiments, insulating portions 104-0 and sacrificial portions 103-0 are removed together, e.g., using the same etching process.

Figure 5A:
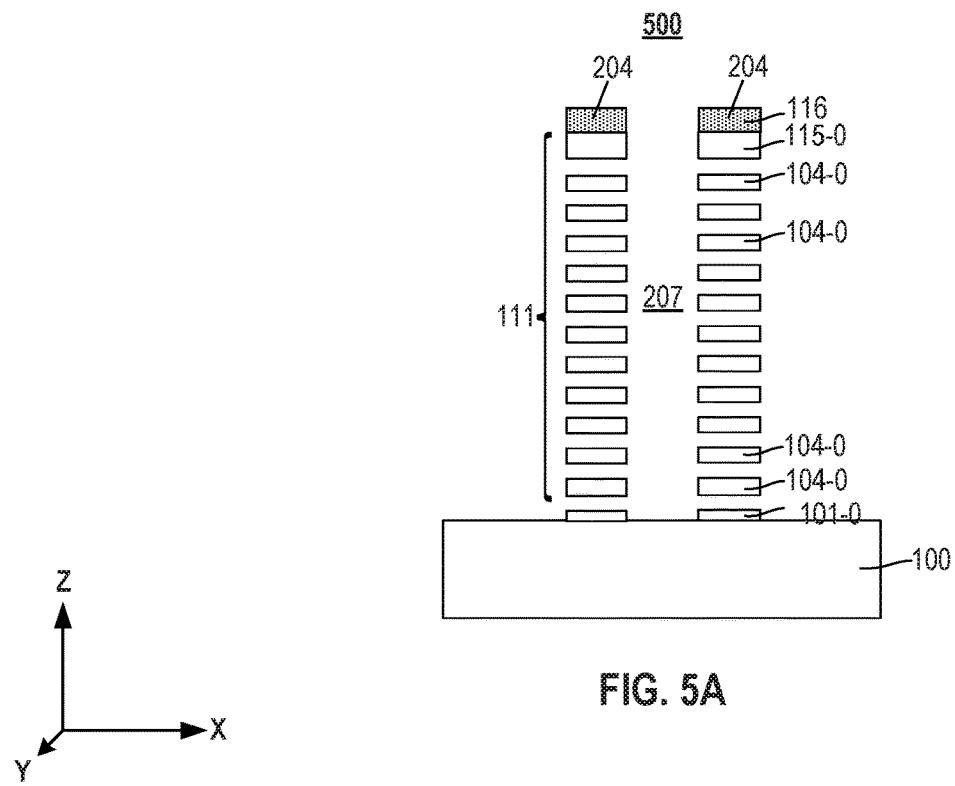
FIG. 5A illustrates a cross-sectional view of the 3D memory device along the E-F direction at another stage of the fabrication process, according to some embodiments of the present disclosure.
Figure 5B:
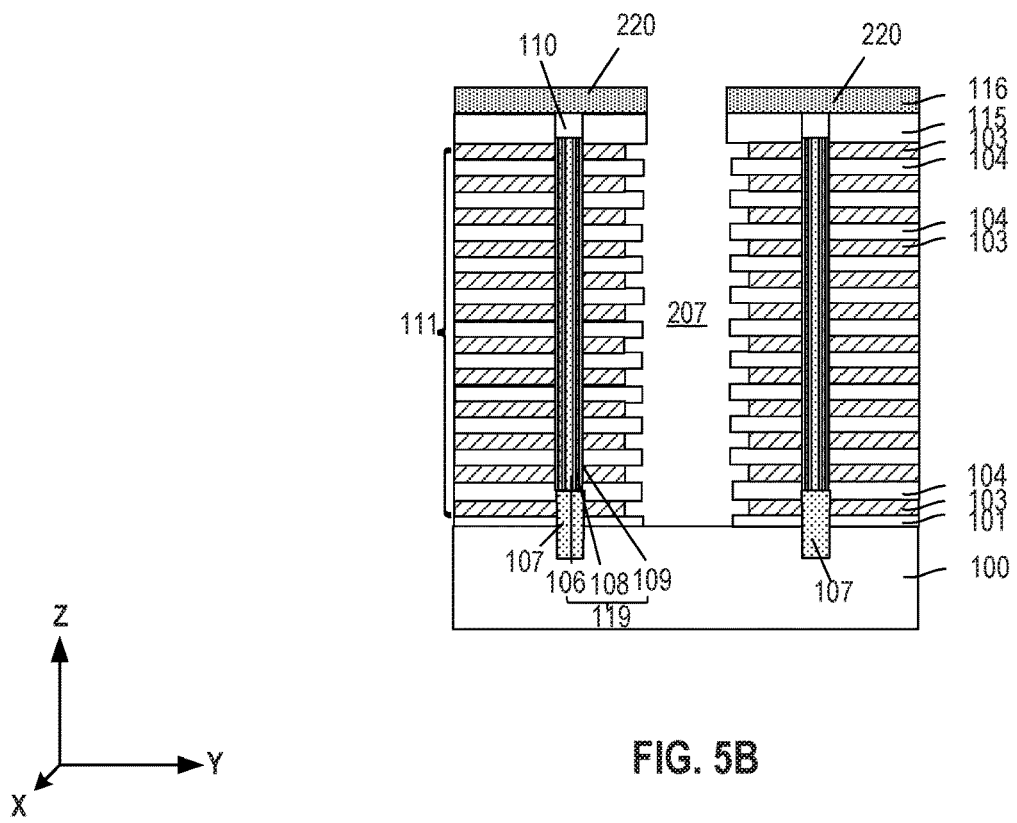
FIG. 5B illustrates a cross-sectional view of the 3D memory device illustrated in FIG. 5A along the C-D direction, according to some embodiments of the present disclosure.
Figure 5C:
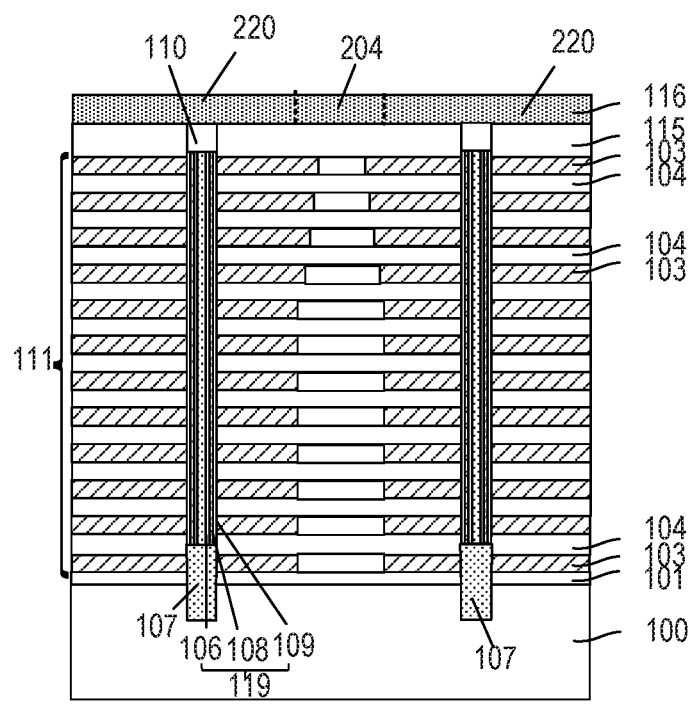
FIG. 5C illustrates a cross-sectional view of the 3D memory device illustrated in FIG. 5A along the A-B direction, according to some embodiments of the present disclosure.
Figure 5C:
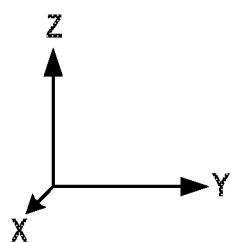

As shown in FIGS. 5A-5C, sacrificial portions 103-0 are first removed. In some embodiments, a suitable isotropic etching process is performed to remove sacrificial portions 103-0. The etchant may selectively etch sacrificial portions 103-0 over insulating portions 104-0. In some embodiments, sacrificial portions 103-0 includes silicon nitride, and the isotropic etching process includes a wet etch which employs phosphoric acid as the etchant.

Figure 6A:
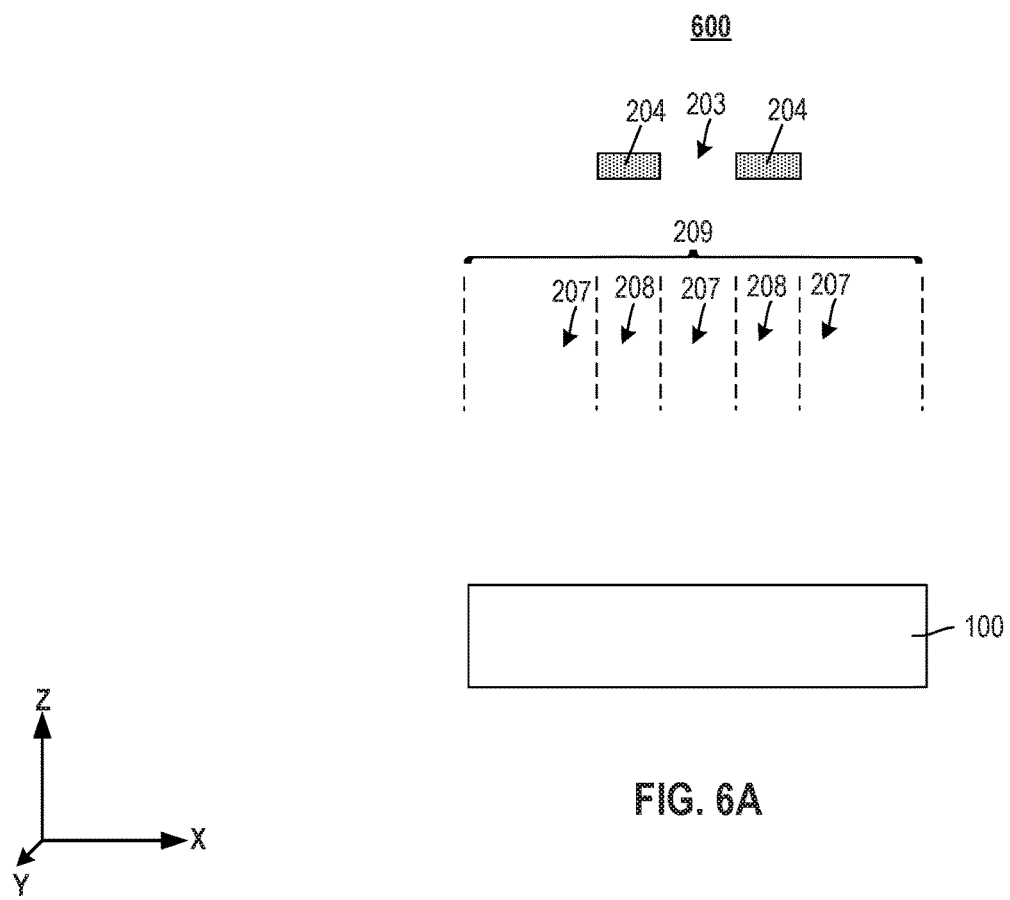
FIG. 6A illustrates a cross-sectional view of the 3D memory device illustrated in FIG. 5A along the E-F direction at another stage of the fabrication process, according to some embodiments of the present disclosure.
Figure 6B:
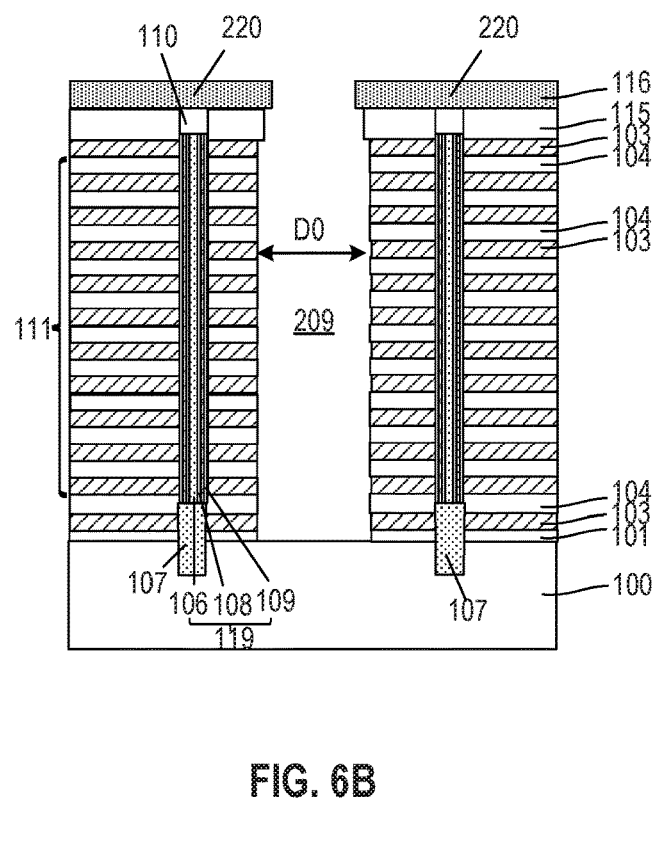
FIG. 6B illustrates a cross-sectional view of the 3D memory device illustrated in FIG. 6A along the C-D direction at the other stage of the fabrication process, according to some embodiments of the present disclosure.
Figure 6C:
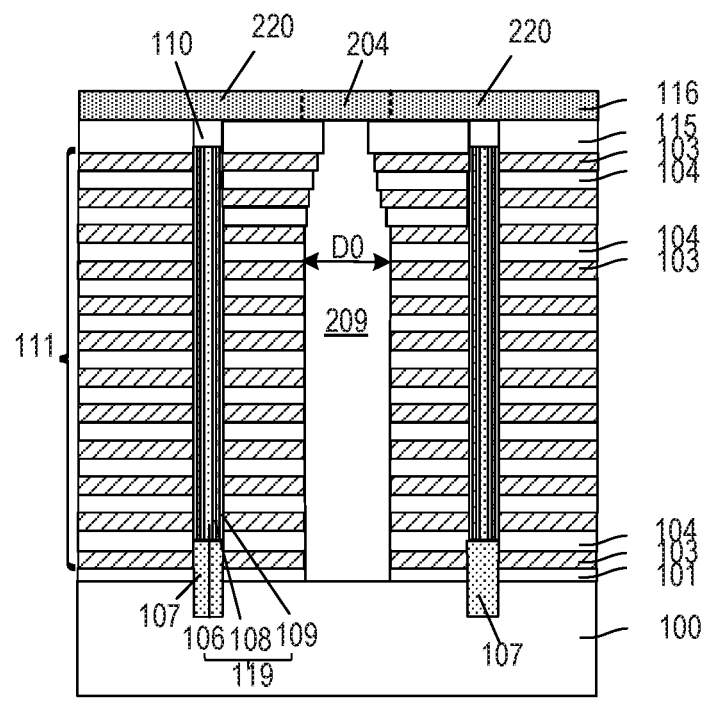
FIG. 6C illustrates a cross-sectional view of the 3D memory device illustrated in FIG. 6A along the A-B direction at the other stage of the fabrication process, according to some embodiments of the present disclosure.
Figure 6C:
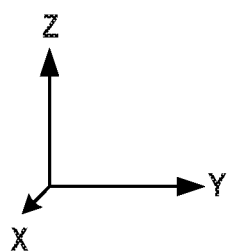

As shown in FIGS. 6A-6C, after sacrificial portions 103-0 are removed, another isotropic etching process can be performed to remove insulating portions 104-0. Stack portion 207-0 may be removed to form second openings 208. First openings 207 and second openings 208 aligned along the x-direction can be connected to one another to form initial slit structure 209. The etchant of the other isotropic etching process may selectively etch insulating portions 104-0 over sacrificial portions 103-0. In some embodiments, insulating portions 104-0 include silicon oxide, and the other isotropic etching process includes a wet etch process, which employs hydrofluoric acid as the etchant.

As shown in FIGS. 5B and 6B, along the C-D direction (e.g., at the second location along the x-direction), the removal of sacrificial portions 103-0 and insulating portions 104-0 may respectively remove portions of sacrificial layers 103 and insulating layers 104 of block portions 160 in contact with first openings 207. For example, as shown in FIG. 5B, the removal of sacrificial portions 103-0 may cause sacrificial layers 103 in contact with first openings 207 to undergo a recess etch, forming a recessed portion on sacrificial layers 103. As shown in FIG. 6B, the removal of insulating portions 104-0 may cause insulating layers 104 in contact with first openings 207 to undergo a recess etch, forming a recessed portion on insulating layers 104. The etched sacrificial layers 103 and insulating layers 104 (e.g., also etched dielectric cap layer 115 and etched buffer oxide layer 101) may cause a width of first opening 207 (or initial slit structure 209) to widen. In some embodiments, the portions of sacrificial layers 103 and insulating layers 104 removed by etching of sacrificial portions 103-0 and insulating portions 104-0 can be negligible.

As shown in FIGS. 5C and 6C, along the A-B direction (e.g., at the first location along the x-direction), because of the coverage of connection portion 204, the removal of dielectric cap portion 115-0, sacrificial portions 103-0, and insulating portions 104-0 may not be as complete at the top portion of initial slit structure 209 as a lower portion (e.g., a middle portion) of initial slit structure 209. The incomplete removal of dielectric cap portion 115-0, sacrificial portions 103-0, and insulating portions 104-0 may cause a width DO of initial slit structure 209 to be less than width DO when no support structure 116 is used. For example, width DO may gradually increase from the top portion to a lower portion of initial slit structure 209. For example, width DO may be the smallest at the top surface of initial slit structure 209, and may increase to a lower portion to initial slit structure. The lower portion can be any position of initial slit structure 209 that is between the top surface of initial slit structure 209 and substrate 100. In some embodiments, the middle portion of initial slit structure 209 is approximately the middle position of initial slit structure 209 along the z-direction. In some embodiments, the variation of DO along the z-direction at the second location is negligible.

Referring back to FIG. 9, after the formation of initial slit structures, the sacrificial layers are removed with a conductor material to form a plurality of conductor layers in each block portion (Operation 908). A recessed portion is formed on each conductor layer along a sidewall of each initial slit structure, form at least one slit structure (Operation 910). A source structure is formed in each slit structure (Operation 912). FIGS. 7A-7C and FIGS. 8A-8C illustrate corresponding structures 700 and 800.

Figure 7A:
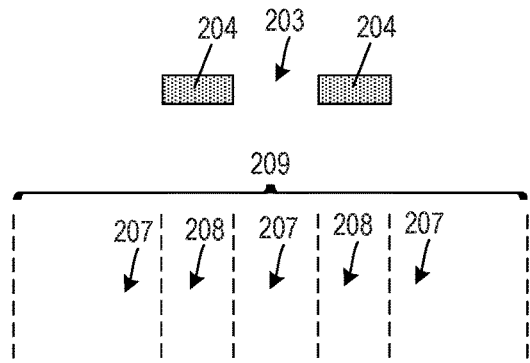
FIG. 7A illustrates a cross-sectional view of the 3D memory device along the E-F direction at another stage of the fabrication process, according to some embodiments of the present disclosure.
Figure 7A:
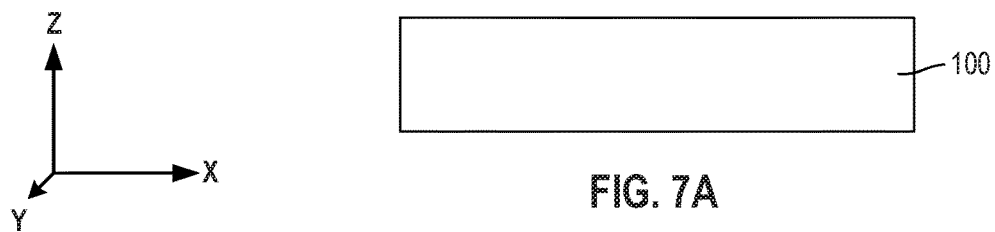
Figure 7B:
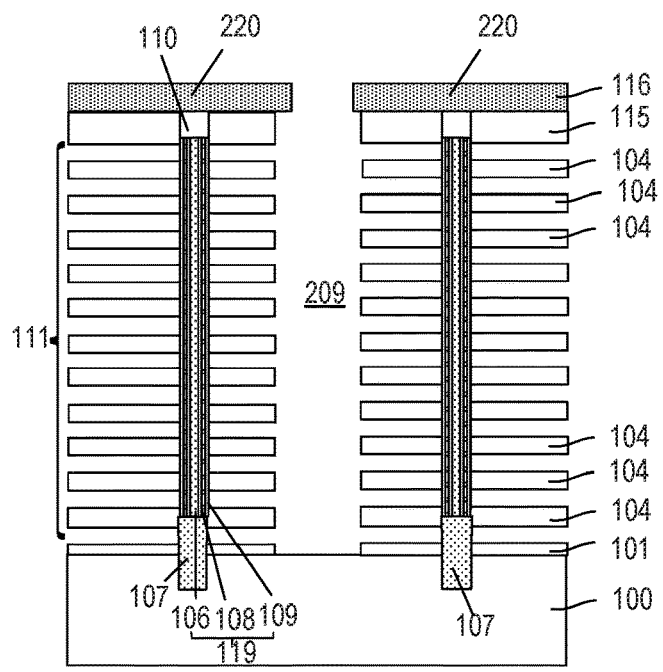
FIG. 7B illustrates a cross-sectional view of the 3D memory device illustrated in FIG. 7A along the C-D direction, according to some embodiments of the present disclosure.
Figure 7C:
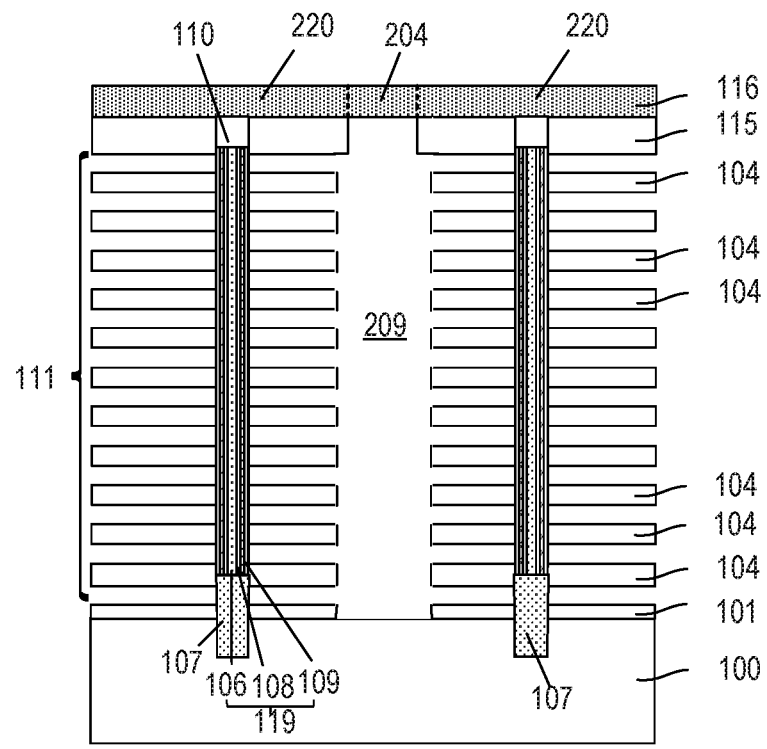
FIG. 7C illustrates a cross-sectional view of the 3D memory device illustrated in FIG. 7A along the A-B direction, according to some embodiments of the present disclosure.
Figure 7C:
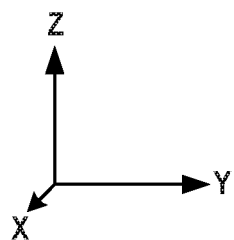

As shown in FIGS. 7A-7C, sacrificial layers 103 in each block portion 160 can be removed through initial slit structure 209 to form a plurality of lateral recesses, each between a pair of adjacent insulating layers 104. A suitable conductor material may be deposited to fill up the lateral recesses, forming a plurality of conductor layers (e.g., 123, 134, and 132) in each block portions 160. Control conductor layers 123 may intersect with semiconductor channels 119 and form a plurality of memory cells in each block portion 160, which forms a memory block. In some embodiments, the lateral recess formed by the removal of the top sacrificial layer 103 in block portion 160 may be filled with the conductor material form a top conductor layer 134, and the lateral recess formed by the removal of the bottom sacrificial layer 103 in block portion 160 may be filled with the conductor material to form a bottom conductor layer 132. In some embodiments, lateral recesses formed by the removal of sacrificial layers 103 between the top and bottom sacrificial layers 103 may be filled with the conductor material to form a plurality of control conductor layers 123.

A suitable isotropic etching process, e.g., wet etch, can be performed to remove sacrificial layers 103, and form the plurality of lateral recesses. The conductor material may include one or more of tungsten, aluminum, copper, cobalt, silicides, and polysilicon. A suitable deposition process, such as CVD, PVD, ALD, and/or sputtering can be performed to deposit the conductor material into the lateral recesses to form conductor layers (e.g., 123, 132, and 134).

As shown in FIGS. 8A-8C, a recess etch may be performed to selectively remove a portion of each conductor layer (e.g., 123, 134, and 132) exposed by the sidewall of initial slit structure 209 to form a recessed portion on each conductor layer (e.g., 123, 134, and 132). Accordingly, an offset can be formed between each conductor layer (e.g., 123, 134, and 132) and adjacent insulating layers 104 along the z-direction. That is, a protruding portion may be formed on each insulating layer 104. In some embodiments, a plurality of protruding portions (e.g., formed on insulating layers 104) and a plurality of recessed portions (e.g., formed on conductor layers (e.g., 123, 134, and 132)) can be formed interleaved with one another along the sidewall of initial slit structure 209. A slit structure, exposing substrate 100, can be formed. In some embodiments, the recessed portions may be formed on insulating layers 104, and the protruding portions may be formed on conductor layers (e.g., 123, 134, and 132). For example, a recess etch may be performed to selectively remove a portion of each insulating layer 104 exposed by the sidewall of initial slit structure 209 to form a recessed portion on each insulating layer 104. The width of the slit structure along the x-direction can be determined based on with DO of initial slit structure 209 and the amount of conductor layers (e.g., 123, 134, and 132) and/or insulating layers 104 removed by the recess etching process. In some embodiments, the width of the slit structure may be equal to or greater than width DO of initial slit structure 209, and may be similar to or the same as width DO of the subsequently formed source structure 140. A suitable isotropic etching process, e.g., wet etch, may be performed to form the recessed portions and protruding portions.

An insulating structure 142 may be formed in slit structure and a source contact 141 may be formed in the respective insulating structure 142, forming source structure 140. In some embodiments, insulating structure 142 includes silicon oxide, and is deposited by one or more of CVD, PVD, ALD, and sputtering. A recess etch may be performed on insulating structure 142 to remove any excess material at the bottom of the slit structure to expose substrate 100. In some embodiments, source contact 141 includes one or more of tungsten, aluminum, copper, cobalt, silicides, and polysilicon, and is formed by a suitable deposition process, e.g., one or more of CVD, PVD, ALD, and sputtering. Source contact 141 may be in contact and form a conductive connection with substrate 100. Cross-sectional views of source structure 140 along the A-B direction (e.g., at the first location along the x-direction) and along the C-D direction (e.g., at the second location along the x-direction) may be referred to the description of FIGS. 1B and 1C, and are not repeated herein.

Support structure 116 may be removed at a suitable stage of the fabrication process. In some embodiments, support structure 116 is performed after the formation of conductor layers (e.g., 123, 132, and 134) and before the formation of source contact 141. In some embodiments, support structure 116 is removed after the formation of source contacts 141. The existence of support structure 116 may have little or no impact on the deposition of insulating structure 142 and source contact 141. In some embodiments, support structure 116 is removed after the formation of source contacts 141 and provides support to the slit structure during the formation of initial slit structures 209 and source contacts 141.

In some embodiments, a 3D memory device includes a memory stack, a plurality of channel structures, a slit structure, and a source structure. The memory stack may be over a substrate and may include interleaved a plurality of conductor layers and a plurality of insulating layers extending laterally in the memory stack. The plurality of channel structures may extend vertically through the memory stack into the substrate. The plurality of channel structures and the plurality of conductor layers may intersect with one another and form a plurality of memory cells. The slit structure may extend vertically and laterally in the memory stack and divide the plurality of memory cells into at least one memory block. The slit structure may include a plurality of protruding portions and a plurality of recessed portions arranged vertically along a sidewall of the slit structure. The source structure may be in the slit structure and may include an insulating structure in contact with the slit structure and a source contact in the insulating structure and in contact with the substrate.

In some embodiments, the insulating structure is in contact with the plurality of protruding portions and the plurality of recessed portions.

In some embodiments, along a lateral direction perpendicular to another lateral direction along which the slit structure extends, at a first location, a width of the slit structure increases from a top surface of the slit structure to at least a middle portion of the slit structure. In some embodiments, at a second location, a width of slit structure decreases from a top surface of the slit structure to the middle portion of the slit structure.

In some embodiments, along the lateral direction, at the first location, a width of the source contact increases from a top surface of the source contact to at least a middle portion of the source contact. In some embodiments, at the second location, a width of the source contact decreases from a top surface of the source contact to the middle portion of the source contact.

In some embodiments, along the lateral direction, the slit structure extends in a first distance range and a second distance range. In some embodiments, in the first distance range, the width of the slit structure increases from the top surface of the slit structure to at least a middle portion of the slit structure and the width of the source contact increases from the top surface of the source contact to at least the middle portion of the source contact. In some embodiments, in the second distance range, the width of slit structure decreases from the top surface of the slit structure to the middle portion of the slit structure and the width of the source contact decreases from the top surface of the source contact to the middle portion of the source contact.

In some embodiments, the contact structure includes at least one of tungsten, aluminum, copper, cobalt, silicides, or polysilicon, The insulating structure may include at least one of silicon oxide, silicon nitride, or silicon oxynitride.

In some embodiments, the plurality of channel structures extend in each of the at least one memory block. Each of the plurality of channel structures includes an epitaxial portion at a bottom of the channel structure and in contact with the substrate, a semiconductor channel over and in contact with the epitaxial portion, and a drain portion over and in contact with the semiconductor channel.

In some embodiments, the semiconductor channel includes a blocking layer, a memory layer, a tunneling layer, a semiconductor layer, and a dielectric core arranged inwardly from a sidewall of the channel structure to a center of the channel structure.

In some embodiments, a 3D memory device includes a stack structure, a support structure, a plurality of first openings, and at least one stack portion. The stack structure may include interleaved a plurality of initial sacrificial layers and a plurality of initial insulating layers over a substrate. The support structure may include a plurality of support openings aligned along a lateral direction and exposing the stack structure and at least one connection portion each in contact with adjacent support openings. The plurality of first openings may be in the stack structure exposed by the plurality of support openings. The plurality of first openings may expose the substrate. The at least one stack portion may be covered by the at least one connection portion, the at least one stack portion each being in contact with adjacent first openings.

In some embodiments, the support structure includes a material different from materials of the plurality of initial insulating layers and the plurality of sacrificial layers.

In some embodiments, the support structure includes at least one of polysilicon, silicon germanium, or silicon carbide.

In some embodiments, the at least one stack portion each includes interleaved a plurality of sacrificial portions and a plurality of insulating portions between the respective connection portion and the substrate.

In some embodiments, the 3D memory device further includes a plurality of channel structures extending vertically through the memory stack into the substrate in each of the plurality of block portions.

In some embodiments, a method for forming a 3D memory device includes forming a support structure over a stack structure. The support structure may include a patterned structure layer having a plurality of support openings aligned along a lateral direction and exposing the stack structure and at least one connection portion each in contact with adjacent support openings, and the stack structure may include interleaved a plurality of initial sacrificial layers and a plurality of initial insulating layers. The method also includes removing, using the support structure as an etch mask, portions of the stack structure exposed by the plurality of support openings to expose the substrate and form a plurality of first openings in the stack structure and at least one stack portion covered by the at least one connection portion, the at least one stack portion each being in contact with adjacent first openings. The method further includes removing the at least one stack portion to form at least one second opening under the at least one connection portion each in contact with the adjacent first openings. The plurality of first openings and the at least one second opening may form an initial slit structure that divides the stack structure into a pair of block portions. Each of the pair of block portion may include interleaved a plurality of sacrificial layers and a plurality of insulating layers.

In some embodiments, the method further includes replacing, through the initial slit structure, the plurality of sacrificial layers in each of the pair of block portions with a plurality of conductor layers, and forming a plurality of recessed portions on the plurality of conductor layers along a sidewall of the initial slit structure. The method may also include forming a slit structure and a plurality of protruding portions on the plurality of insulating layers and forming a source structure in the slit structure. The source structure may be in contact with the substrate and the plurality of conductor layers and insulating layers.

In some embodiments, forming the support structure includes forming a support layer over the stack structure and forming a patterned photoresist layer over the support layer.

The patterned photoresist layer may include a plurality of mask openings corresponding to the support openings and a mask portion corresponding to the connection portion. Forming the support structure may also include etch, using the patterned photoresist layer as an etch mask to remove portions of the support layer to expose the stack structure, forming the support structure.

In some embodiments, the method further includes forming a plurality of pits on a top surface of the stack structure before a formation of the support layer and filling the plurality of pits with the support layer.

In some embodiments, removing, using the support structure as an etch mask, portions of the stack structure includes performing an anisotropic etching process to remove the portions of the stack structure.

In some embodiments, removing the stack portion to form at least one second opening includes performing an isotropic etching process to respectively remove a plurality of sacrificial portions and a plurality of insulating portions under the connection portion.

In some embodiments, removing the plurality of sacrificial portions includes performing a wet etching process, the plurality of sacrificial portions including silicon nitride and an etchant for the wet etching process including phosphoric acid. Removing the plurality of insulating portions may include performing another wet etching process. The plurality of insulating portions may include silicon oxide and an etchant for the other wet etching process including hydrofluoric acid.

In some embodiments, replacing, through the initial slit structure, the plurality of sacrificial layers in each of the pair of block portions with a plurality of conductor layers includes performing an isotropic etching process to remove the plurality of sacrificial layers in each of the pair of block portions to form a plurality lateral recesses in each of the pair of block portions and depositing a conductor material to fill up the plurality of lateral recesses in each of the pair of block portions.

In some embodiments, forming a plurality of recessed portions on the plurality of conductor layers includes performing a recess etching process that selectively etches the plurality of conductor layers over the plurality of insulating layers to form an offset between each of the plurality of conductor layers and adjacent insulating layers along the sidewall of the initial slit structure, and forming the plurality of protruding portions on the plurality of insulating layers, the plurality of recessed portions on the plurality of conductor layers, and the slit structure.

In some embodiments, forming a source structure includes forming an insulating structure in the slit structure. The insulating structure may be in contact with the plurality of recessed portions and the plurality of protruding portions and exposing the substrate. Forming the source structure may also include forming the source contact in the insulating structure, the source contact in contact with the substrate.

In some embodiments, the method further includes removing the support structure after a formation of the source structure.

In some embodiments, the method further includes forming at least one channel structure in a portion of the stack structure that corresponds to each of the pair of block portions before a formation of the support structure. Forming at least one channel structure may include forming at least one channel hole in the portion of the stack structure. The at least one channel hole may each extend vertically in the stack structure and exposing the substrate. Forming at least one channel structure may also include forming an epitaxial portion, being in contact with the substrate, at a bottom of each of the at least one channel hole, forming a semiconductor channel over and in contact with the epitaxial portion, and forming a drain structure over and in contact with the semiconductor channel.

In some embodiments, a method for forming a 3D memory device includes forming a support structure over a stack structure. The stack structure may include interleaved a plurality of initial sacrificial layers and a plurality of initial insulating layers and is divided into a plurality of block portions, and the support structure may include a patterned support layer having a plurality of block-masking portions covering the plurality of block portions and at least one connection portion in contact with adjacent block-masking portions. The method may also include removing, using the support structure as an etch mask, portions of the stack structure to form a plurality of first openings in the stack structure between adjacent block portions and at least one stack portion covered by the at least one connection portion, the at least one stack portion each being in contact with adjacent block portions and adjacent first openings. The method may further include removing the at least one stack portion to form an initial slit structure between the adjacent block portions, forming interleaved a plurality of conductor layers and a plurality of insulating layers in each of the plurality of block-masking portions, the at least one connection portion being over the initial slit structure and in contact with the adjacent block-masking portions. The method may further include replacing, through the initial slit structure, the plurality of sacrificial layers in each of the plurality of block portions with a plurality of conductor layers. The method may further include forming a plurality of recessed portions on the plurality of conductor layers along a sidewall of the initial slit structure to form a slit structure and a plurality of protruding portions on the plurality of insulating layers and forming a source structure in the slit structure. The source structure may be in contact with the substrate and the plurality of conductor layers and insulating layers.

In some embodiments, forming the support structure includes forming a support layer over the stack structure, forming a patterned photoresist layer over the support layer, the patterned photoresist layer including a plurality of mask openings corresponding to the support openings and a mask portion corresponding to the connection portion, and etch, using the patterned photoresist layer as an etch mask to remove portions of the support layer to expose the stack structure, forming the support structure.

In some embodiments, the method further includes forming a plurality of pits on a top surface of the stack structure before a formation of the support layer and filling the plurality of pits with the support layer.

In some embodiments, removing the at least one stack portion includes performing an isotropic etching process to respectively remove a plurality of sacrificial portions and a plurality of insulating portions under the connection portion.

In some embodiments, removing the plurality of sacrificial portions includes performing a wet etching process. The plurality of sacrificial portions may include silicon nitride and an etchant for the wet etching process including phosphoric acid. In some embodiments, removing the plurality of insulating portions includes performing another wet etching process. The plurality of insulating portions may include silicon oxide and an etchant for the other wet etching process including hydrofluoric acid.

In some embodiments, forming a plurality of recessed portions on the plurality of conductor layers includes performing a recess etching process that selectively etches the plurality of conductor layers over the plurality of insulating layers to form an offset between each of the plurality of conductor layers and adjacent insulating layers along the sidewall of the initial slit structure, and forming the plurality of protruding portions on the plurality of insulating layers, the plurality of recessed portions on the plurality of conductor layers, and the slit structure.

In some embodiments, forming a source structure includes forming an insulating structure in the slit structure. The insulating structure may be in contact with the plurality of recessed portions and the plurality of protruding portions and exposing the substrate. In some embodiments, forming the source structure also includes forming the source contact in the insulating structure, the source contact in contact with the substrate.

In some embodiments, the method further includes removing the support structure after a formation of the source structure.

In some embodiments, the method further includes forming at least one channel structure in a portion of the stack structure that corresponds to each of the plurality of block portions before a formation of the support structure. Forming at least one channel structure may include forming at least one channel hole in the portion of the stack structure, the at least one channel hole each extending vertically in the stack structure and exposing the substrate. Forming at least one channel structure may also include forming an epitaxial portion at a bottom of each of the at least one channel hole, forming a semiconductor channel over and in contact with the epitaxial portion, and forming a drain structure over and in contact with the semiconductor channel. The epitaxial portion may be in contact with the substrate.

The foregoing description of the specific embodiments will so reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A three-dimensional (3D) memory device, comprising:
a memory stack over a substrate, the memory stack comprising interleaved a plurality of conductor layers and a plurality of insulating layers extending laterally in the memory stack;
a plurality of channel structures extending vertically through the memory stack into the substrate, the plurality of channel structures and the plurality of conductor layers intersecting with one another and forming a plurality of memory cells;
a slit structure extending vertically and laterally in the memory stack and dividing the plurality of memory cells into at least one memory block, the slit structure comprising a plurality of protruding portions and a plurality of recessed portions arranged vertically along a sidewall of the slit structure; and
a source structure in the slit structure, the source structure comprising an insulating structure in contact with the slit structure and a source contact in the insulating structure and in contact with the substrate, wherein along a lateral direction perpendicular to another lateral direction along which the slit structure extends,
at a first location, a width of the slit structure increases from a top surface of the slit structure to at least a middle portion of the slit structure; and
at a second location, the width of the slit structure decreases from the top surface of the slit structure to the middle portion of the slit structure.

2. The 3D memory device of claim 1, wherein the insulating structure is in contact with the plurality of protruding portions and the plurality of recessed portions.

3. The 3D memory device of claim 1, wherein along the lateral direction,
at the first location, a width of the source contact increases from a top surface of the source contact to at least a middle portion of the source contact; and
at the second location, a width of the source contact decreases from a top surface of the source contact to the middle portion of the source contact.

4. The 3D memory device of claim 3, wherein along the lateral direction, the slit structure extends in a first distance range and a second distance range, and wherein
in the first distance range, the width of the slit structure increases from the top surface of the slit structure to at least the middle portion of the slit structure and the width of the source contact increases from the top surface of the source contact to at least the middle portion of the source contact; and
in the second distance range, the width of slit structure decreases from the top surface of the slit structure to the middle portion of the slit structure and the width of the source contact decreases from the top surface of the source contact to the middle portion of the source contact.

5. The 3D memory device of claim 4, wherein
the source contact comprises at least one of tungsten, aluminum, copper, cobalt, silicides, or polysilicon and the insulating structure comprises at least one of silicon oxide, silicon nitride, or silicon oxynitride; and
the plurality of channel structures extend in each of the at least one memory block, and each of the plurality of channel structures comprises an epitaxial portion at a bottom of the channel structure and in contact with the substrate, a semiconductor channel over and in contact with the epitaxial portion, and a drain portion over and in contact with the semiconductor channel.

6. A method for forming a three-dimensional (3D) memory device, comprising:
- forming a support structure over a stack structure, wherein
  - the support structure comprises a patterned structure layer having a plurality of support openings aligned along a lateral direction and exposing the stack structure and at least one connection portion each in contact with adjacent support openings, and
  - the stack structure comprises interleaved a plurality of sacrificial layers and a plurality of insulating layers over a substrate,
- removing, using the support structure as an etch mask, portions of the stack structure exposed by the plurality of support openings to expose the substrate and form a plurality of first openings in the stack structure and at least one stack portion covered by the at least one connection portion, the at least one stack portion each being in contact with adjacent first openings; and
- removing the at least one stack portion to form at least one second opening under the at least one connection portion each in contact with the adjacent first openings, the plurality of first openings and the at least one second opening forming an initial slit structure that divides the stack structure into a pair of block portions, each of the pair of block portion comprising interleaved a plurality of sacrificial layers and a plurality of insulating layers.

7. The method of claim 6, further comprising:
- replacing, through the initial slit structure, the plurality of sacrificial layers in each of the pair of block portions with a plurality of conductor layers;
- forming a plurality of recessed portions on the plurality of conductor layers along a sidewall of the initial slit structure;
- forming a slit structure and a plurality of protruding portions on the plurality of insulating layers; and
- forming a source structure in the slit structure, the source structure being in contact with the substrate and the plurality of conductor layers and insulating layers.

8. The method of claim 7, wherein
- forming a plurality of recessed portions on the plurality of conductor layers comprises:
  - performing a recess etching process that selectively etches the plurality of conductor layers over the plurality of insulating layers to form an offset between each of the plurality of conductor layers and adjacent insulating layers along the sidewall of the initial slit structure, and
  - forming the plurality of protruding portions on the plurality of insulating layers, the plurality of recessed portions on the plurality of conductor layers, and the slit structure; and
- forming the source structure comprises:
  - forming an insulating structure in the slit structure, the insulating structure in contact with the plurality of recessed portions and the plurality of protruding portions and exposing the substrate, and
  - forming a source contact in the insulating structure, the source contact in contact with the substrate.

9. The method of claim 7, further comprising removing the support structure after a formation of the source structure.

10. The method of claim 6, wherein forming the support structure comprises:
- forming a support layer over the stack structure;
- forming a patterned photoresist layer over the support layer, the patterned photoresist layer comprising a plurality of mask openings corresponding to the support openings and a mask portion corresponding to the connection portion; and
- etching, using the patterned photoresist layer as an etch mask to remove portions of the support layer to expose the stack structure, forming the support structure.

11. The method of claim 10, further comprising:
- forming a plurality of pits on a top surface of the stack structure before a formation of the support layer; and
- filling the plurality of pits with the support layer.

12. The method of claim 6, wherein removing, using the support structure as an etch mask, portions of the stack structure comprises performing an anisotropic etching process to remove the portions of the stack structure.

13. The method of claim 12, wherein removing the stack portion to form at least one second opening comprises performing an isotropic etching process to respectively remove a plurality of sacrificial portions and a plurality of insulating portions under the connection portion.

14. The method of claim 13, wherein
- removing the plurality of sacrificial portions comprises performing a wet etching process, the plurality of sacrificial portions comprising silicon nitride and an etchant for the wet etching process comprising phosphoric acid; and
- removing the plurality of insulating portions comprises performing another wet etching process, the plurality of insulating portions comprising silicon oxide and an etchant for the other wet etching process comprising hydrofluoric acid.

15. A method for forming a three-dimensional (3D) memory device, comprising:
- forming a support structure over a stack structure, wherein
  - the stack structure comprises interleaved a plurality of sacrificial layers and a plurality of insulating layers over a substrate and is divided into a plurality of block portions, and
  - the support structure comprises a patterned support layer having a plurality of block-masking portions covering the plurality of block portions and at least one connection portion in contact with adjacent block-masking portions, and
- removing, using the support structure as an etch mask, portions of the stack structure to form a plurality of first openings in the stack structure between adjacent block portions and at least one stack portion covered by the at least one connection portion, the at least one stack portion each being in contact with adjacent block portions and adjacent first openings;
- removing the at least one stack portion to form an initial slit structure between the adjacent block portions, forming interleaved a plurality of conductor layers and a plurality of insulating layers in each of the plurality of block-masking portions, the at least one connection portion being over the initial slit structure and in contact with the adjacent block-masking portions;
- replacing, through the initial slit structure, the plurality of sacrificial layers in each of the plurality of block portions with a plurality of conductor layers; and
- forming a plurality of recessed portions on the plurality of conductor layers along a sidewall of the initial slit structure, forming a slit structure and a plurality of protruding portions on the plurality of insulating layers; and
- forming a source structure in the slit structure, the source structure being in contact with the substrate and the plurality of conductor layers and insulating layers.

16. The method of claim 15, wherein forming the support structure comprises:

forming a support layer over the stack structure;

forming a patterned photoresist layer over the support layer, the patterned photoresist layer comprising a plurality of mask openings corresponding to support openings and a mask portion corresponding to the connection portion; and etch, using the patterned photoresist layer as an etch mask to remove portions of the support layer to expose the stack structure, forming the support structure.

17. The method of claim 16, further comprising:

forming a plurality of pits on a top surface of the stack structure before a formation of the support layer; and filling the plurality of pits with the support layer.

18. The method of claim 15, wherein removing the at least one stack portion comprises performing an isotropic etching process to respectively remove a plurality of sacrificial portions and a plurality of insulating portions under the connection portion;

removing the plurality of sacrificial portions comprises performing a wet etching process, the plurality of sacrificial portions comprising silicon nitride and an etchant for the wet etching process comprising phosphoric acid; and removing the plurality of insulating portions comprises performing another wet etching process, the plurality of insulating portions comprising silicon oxide and an etchant for the other wet etching process comprising hydrofluoric acid.

19. The method of claim 18, wherein forming a plurality of recessed portions on the plurality of conductor layers comprises:

performing a recess etching process that selectively etches the plurality of conductor layers over the plurality of insulating layers to form an offset between each of the plurality of conductor layers and adjacent insulating layers along the sidewall of the initial slit structure, and forming the plurality of protruding portions on the plurality of insulating layers, the plurality of recessed portions on the plurality of conductor layers, and the slit structure; and forming a source structure comprises:

forming an insulating structure in the slit structure, the insulating structure in contact with the plurality of recessed portions and the plurality of protruding portions and exposing the substrate, and forming a source contact in the insulating structure, the source contact in contact with the substrate.

* * * * *